United States Patent
Siau et al.

(10) Patent No.: US 9,595,325 B2
(45) Date of Patent: Mar. 14, 2017

(54) APPARATUS AND METHODS FOR SENSING HARD BIT AND SOFT BITS

(71) Applicant: SanDisk Technologies Inc., Plano, TX (US)

(72) Inventors: Chang Siau, Saratoga, CA (US); Jeffrey Koon Yee Lee, Fremont, CA (US); Tianhong Yan, Saratoga, CA (US); Yingchang Chen, Cupertino, CA (US); Gopinath Balakrishnan, San Jose, CA (US); Tz-yi Liu, Palo Alto, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/087,379

(22) Filed: Mar. 31, 2016

(65) Prior Publication Data

US 2016/0217854 A1    Jul. 28, 2016

Related U.S. Application Data

(62) Division of application No. 14/500,476, filed on Sep. 29, 2014, now Pat. No. 9,318,194.

(51) Int. Cl.
| | | |
|---|---|---|
| G11C 7/02 | (2006.01) | |
| G11C 13/00 | (2006.01) | |
| G11C 16/28 | (2006.01) | |
| G11C 16/32 | (2006.01) | |
| G11C 27/02 | (2006.01) | |

(52) U.S. Cl.
CPC ........ *G11C 13/004* (2013.01); *G11C 13/0028* (2013.01); *G11C 13/0061* (2013.01); *G11C 16/28* (2013.01); *G11C 16/32* (2013.01); *G11C 27/02* (2013.01); *G11C 2013/0054* (2013.01)

(58) Field of Classification Search
CPC .................................................. G11C 13/004
USPC .......................................................... 365/207
See application file for complete search history.

(56) References Cited

U.S. PATENT DOCUMENTS

| | | |
|---|---|---|
| 2011/0110144 A1 | 5/2011 | Kawal |
| 2013/0151753 A1 | 6/2013 | Jeon et al. |
| 2014/0233317 A1 | 8/2014 | Bellorado et al. |
| 2016/0093372 A1* | 3/2016 | Fainzilber ........... G06F 11/1008 714/764 |

OTHER PUBLICATIONS

International Search Report and Written Opinion dated Nov. 19, 2015 in International Patent Application No. PCT/US2015/047626.
Requirement for Restriction/Election mailed Nov. 10, 2015 in U.S. Appl. No. 14/500,476.
Response to Election/Restriction mailed Nov. 28, 2015 in U.S. Appl. No. 14/500,476.
Notice of Allowance and Fees Due mailed Jan. 20, 2016 in U.S. Appl. No. 14/500,476.

\* cited by examiner

*Primary Examiner* — Hoai V Ho
(74) *Attorney, Agent, or Firm* — Vierra Magen Marcus LLP

(57) ABSTRACT

A method is provided for reading a memory cell of a nonvolatile memory system. The method includes generating a hard bit and N soft bits for the memory cell in a total time corresponding to a single read latency period and N+1 data transfer times.

3 Claims, 23 Drawing Sheets

APPARATUS AND METHODS FOR SENSING HARD BIT AND SOFT BITS

CLAIM OF PRIORITY

The present application is a divisional of U.S. patent application Ser. No. 14/500,476, entitled "APPARATUS AND METHODS FOR SENSING HARD BIT AND SOFT BITS," filed Sep. 29, 2014, which is herein incorporated by reference in its entirety for all purposes.

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devi have been scaled in order to reduce the cost per bit. However, as process geometries shrink, many design and process challenges are presented. These challenges include increased variability in memory cell I-V characteristics, reduced memory cell sensing currents, and increased bit line settling times.

DETAILED DESCRIPTION

Figure 1A:
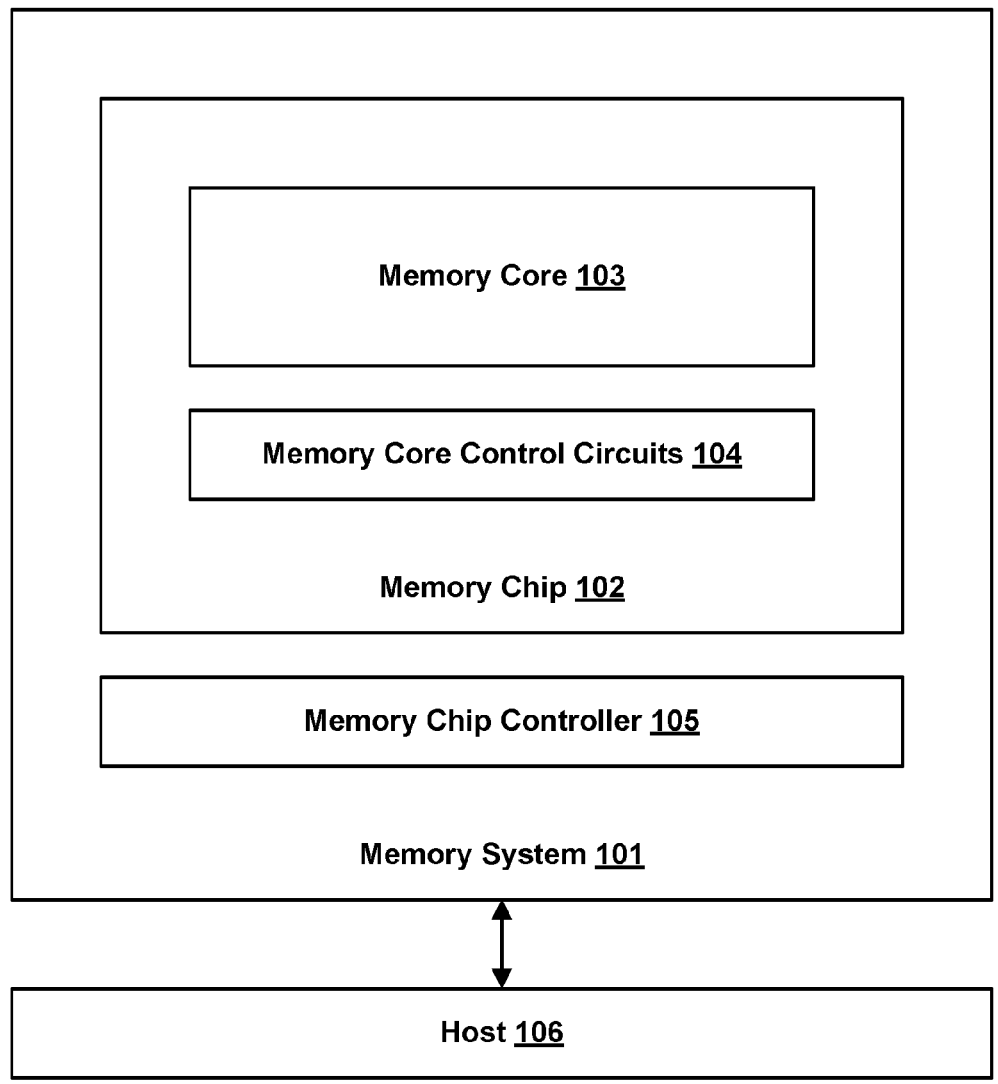
FIG. 1A depicts an embodiment of a memory system and a host.

Technology is described for reading a memory cell of a nonvolatile memory system. In particular, technology is described for generating a hard bit and N soft bits for the memory cell in a total time corresponding to a single read latency period and N+1 data transfer times.

In some embodiments, a memory array may include a cross-point memory array. A cross-point memory array may refer to a memory array in which two-terminal memory cells are placed at the intersections of a first set of control lines (e.g., word lines) arranged in a first direction and a second set of control lines (e.g., bit lines) arranged in a second direction perpendicular to the first direction. The two-terminal memory cells may include a resistance-switching material, such as a phase change material, a ferroelectric material, or a metal oxide (e.g., nickel oxide or hafnium oxide). In some cases, each memory cell in a cross-point memory array may be placed in series with a steering element or an isolation element, such as a diode, in order to reduce leakage currents. In cross-point memory arrays where the memory cells do not include an isolation element, controlling and minimizing leakage currents may be a significant issue, especially since leakage currents may vary greatly over biasing voltage and temperature.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may include a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may include a non-volatile storage system interfacing with the host (e.g., a mobile computing device). In some cases, the memory system 101 may be embedded within the host 106. In other cases, the memory system 101 may include a memory card. As depicted, the memory system 101 includes a memory chip controller 105 and a memory chip 102. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit. In other embodiments, memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, or generating row and column addresses. The memory core 103 may include one or more two-dimensional arrays of memory cells or one or more three-dimensional arrays of memory cells. In one embodiment, the memory core control circuits 104 and memory core 103 are arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 will send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

As depicted in FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array. The one or more managing or control circuits may provide control signals to a memory array in order to perform a read operation and/or a write operation on the memory array. In one example, the one or more managing or control circuits may include any one of or a combination of control circuitry, state machine, decoders, sense amplifiers, read/write circuits, and/or controllers. The one or more managing circuits may perform or facilitate one or more memory array operations including erasing, programming, or reading operations. In one example, one or more managing circuits may include an on-chip memory controller for determining row and column address, word line and bit line addresses, memory array enable signals, and data latching signals.

Figure 1B:
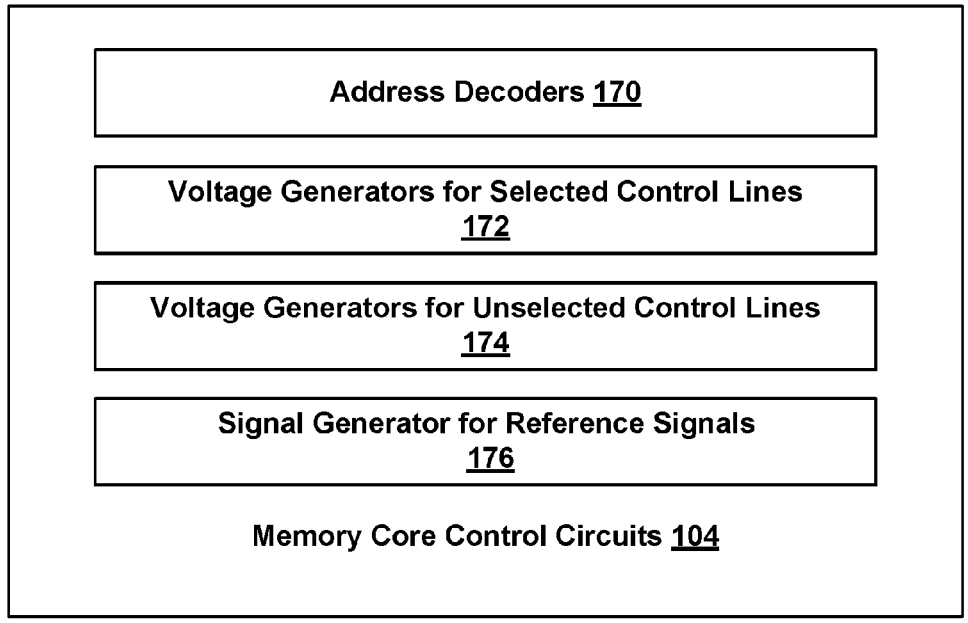
FIG. 1B depicts an embodiment of memory core control circuits.

FIG. 1B depicts one embodiment of memory core control circuits 104. As depicted, the memory core control circuits 104 include address decoders 170, voltage generators for selected control lines 172, voltage generators for unselected control lines 174 and signal generators for reference signals 176 (described in more detail below). Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may include one or more voltage generators for generating selected control line voltages. The voltage generators for unselected control lines 174 may include one or more voltage generators for generating unselected control line voltages. The signal generators for reference signals 176 may include one or more voltage or current generators for generating reference voltage or current signals. Address decoders 170 may generate memory block addresses, as well as row addresses and column addresses for a particular memory block.

FIGS. 1C-1F depict one embodiment of a memory core organization that includes a memory core having multiple memory bays, and each memory bay having multiple memory blocks. Although a memory core organization is disclosed where memory bays include memory blocks, and memory blocks include a group of memory cells, other organizations or groupings can also be used with the technology described herein.

Figure 1C:
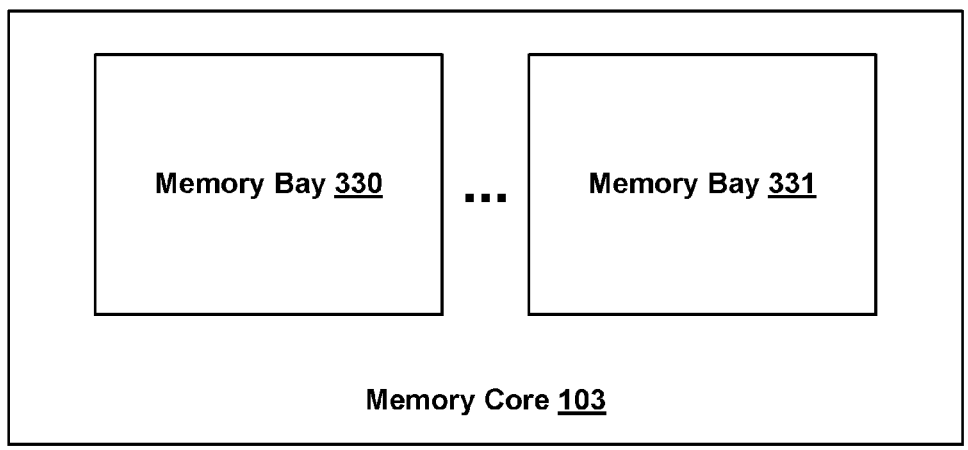
FIG. 1C depicts an embodiment of a memory core.

FIG. 1C depicts one embodiment of memory core 103 in FIG. 1A. As depicted, memory core 103 includes memory bay 330 and memory bay 331. In some embodiments, the number of memory bays per memory core can be different for different implementations. For example, a memory core may include only a single memory bay or a plurality of memory bays (e.g., 16 memory bays).

Figure 1D:
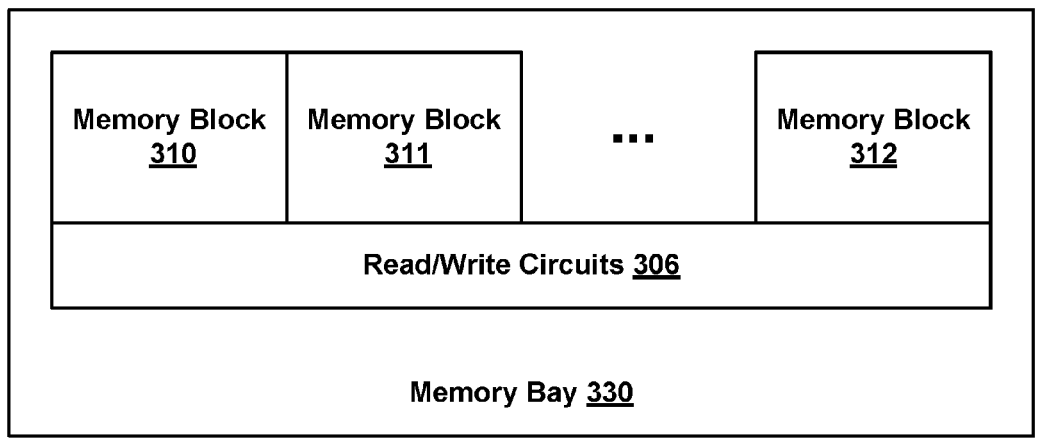
FIG. 1D depicts an embodiment of a memory bay.

FIG. 1D depicts one embodiment of memory bay 330 in FIG. 1C. As depicted, memory bay 330 includes memory blocks 310-312 and read/write circuits 306. In some embodiments, the number of memory blocks per memory bay may be different for different implementations. For example, a memory bay may include one or more memory blocks (e.g., 32 memory blocks per memory bay). Read/write circuits 306 include circuitry for reading and writing memory cells within memory blocks 310-312. As depicted, the read/write circuits 306 may be shared across multiple memory blocks within a memory bay. This allows chip area to be reduced since a single group of read/write circuits 306 may be used to support multiple memory blocks. However, in some embodiments, only a single memory block may be electrically coupled to read/write circuits 306 at a particular time to avoid signal conflicts.

In some embodiments, read/write circuits 306 may be used to write one or more pages of data into the memory blocks 310-312 (or into a subset of the memory blocks). The memory cells within the memory blocks 310-312 may permit direct over-writing of pages (i.e., data representing a page or a portion of a page may be written into the memory blocks 310-312 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address and/or to acquire overhead information (e.g., ECC information) before performing a write operation to write the set of data to the target address.

In some cases, read/write circuits 306 may be used to program a particular memory cell to be in one of three or more data/resistance states (i.e., the particular memory cell may include a multi-level memory cell). In one example, the read/write circuits 306 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 306 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

Figure 1E:
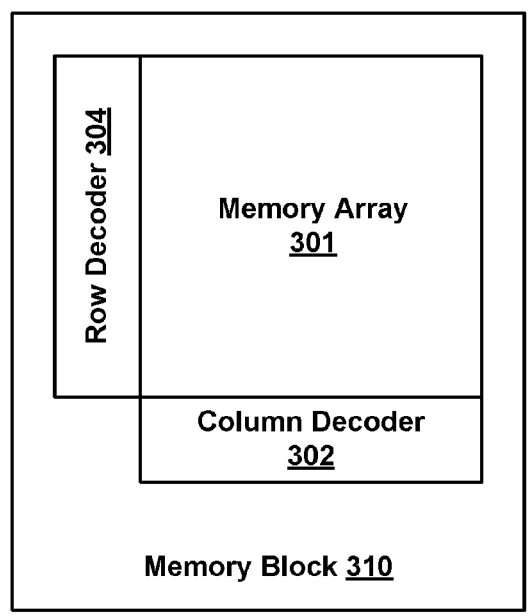
FIG. 1E depicts an embodiment of a memory block.

FIG. 1E depicts one embodiment of memory block 310 in FIG. 1D. As depicted, memory block 310 includes a memory array 301, row decoder 304, and column decoder 302. Memory array 301 may include a contiguous group of memory cells having contiguous word lines and bit lines. Memory array 301 may include one or more layers of memory cells. Memory array 310 may include a two-dimensional memory array or a three-dimensional memory array. The row decoder 304 decodes a row address and selects a particular word line in memory array 301 when appropriate (e.g., when reading or writing memory cells in memory array 301). The column decoder 302 decodes a column address and selects a particular group of bit lines in memory array 301 to be electrically coupled to read/write circuits, such as read/write circuits 306 in FIG. 1D. In one embodiment, the number of word lines is 4K per memory layer, the number of bit lines is 1K per memory layer, and the number of memory layers is 4, providing a memory array 301 containing 16M memory cells.

Figure 1F:
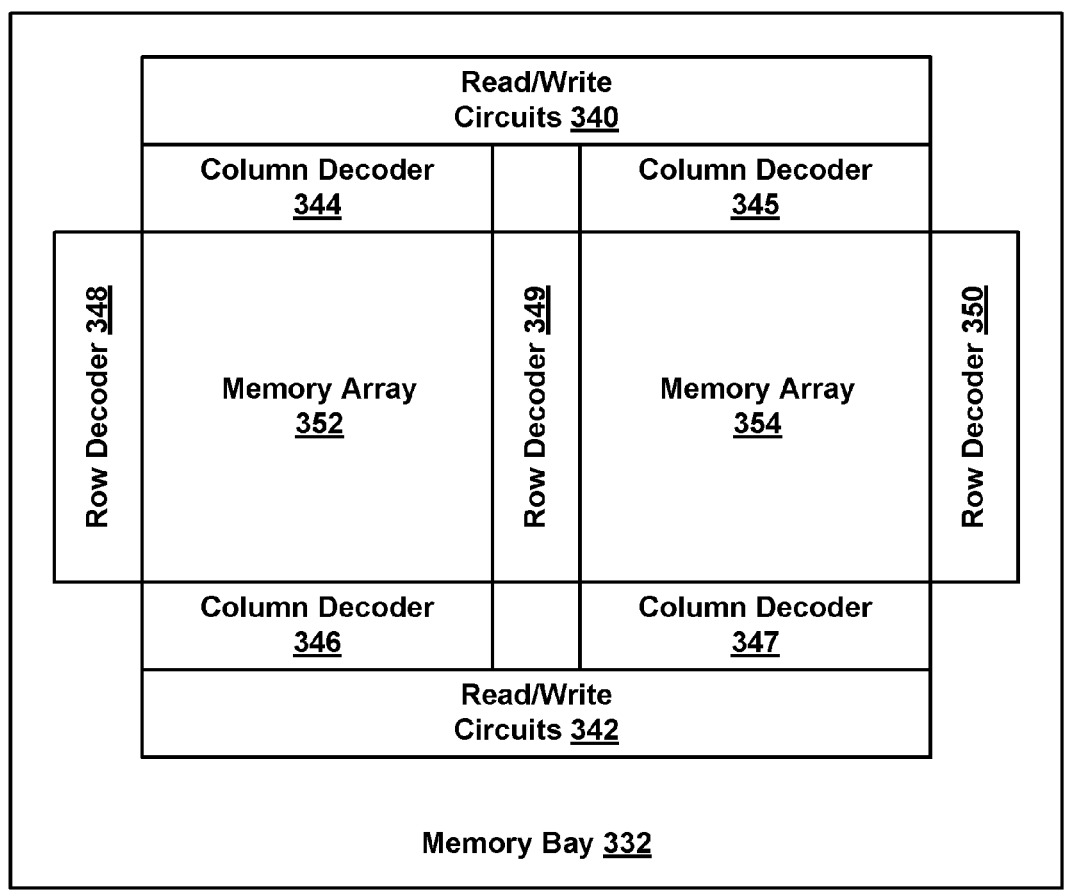
FIG. 1F depicts another embodiment of a memory bay.

FIG. 1F depicts one embodiment of a memory bay 332. Memory bay 332 is one example of an alternative implementation for memory bay 330 in FIG. 1D. In some embodiments, row decoders, column decoders, and read/write circuits may be split or shared between memory arrays. As depicted, row decoder 349 is shared between memory arrays 352 and 354 because row decoder 349 controls word lines in both memory arrays 352 and 354 (i.e., the word lines driven by row decoder 349 are shared). Row decoders 348 and 349 may be split such that even word lines in memory array 352 are driven by row decoder 348 and odd word lines in memory array 352 are driven by row decoder 349. Column decoders 344 and 346 may be split such that even bit lines in memory array 352 are controlled by column decoder 346 and odd bit lines in memory array 352 are driven by column decoder 344. The selected bit lines controlled by column decoder 344 may be electrically coupled to read/write circuits 340. The selected bit lines controlled by column decoder 346 may be electrically coupled to read/write circuits 342. Splitting the read/write circuits into read/write circuits 340 and 342 when the column decoders are split may allow for a more efficient layout of the memory bay.

Figure 2A:
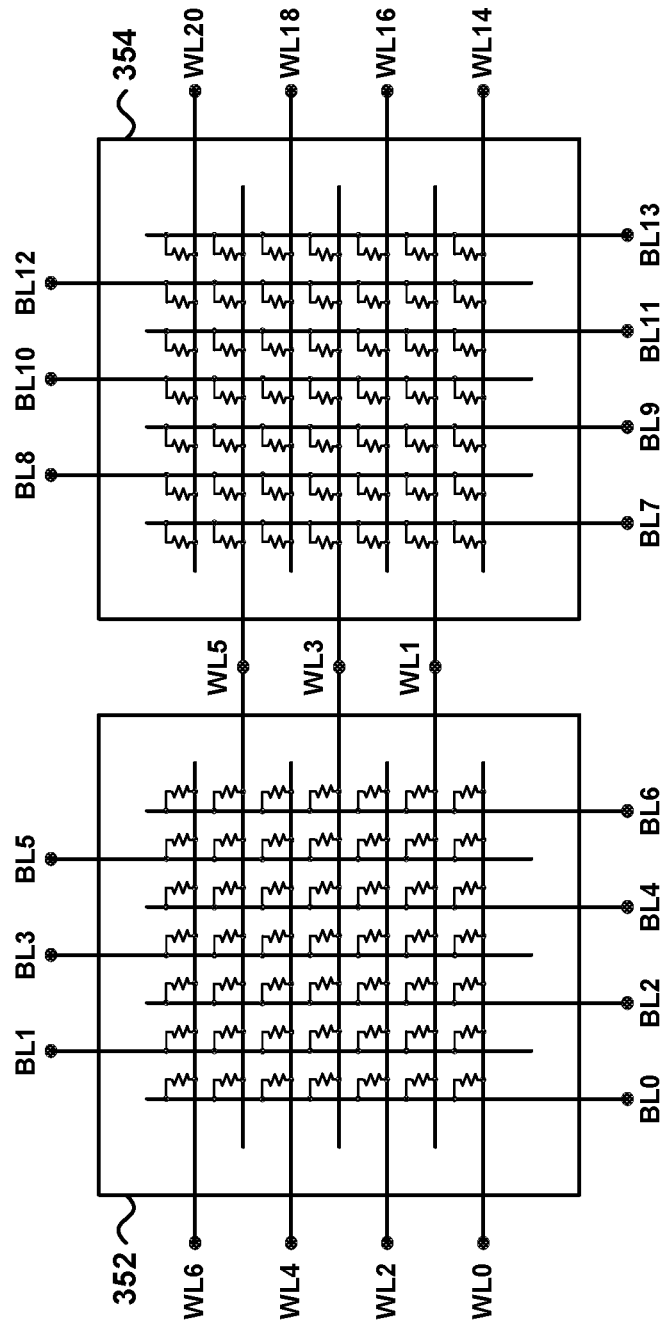
FIG. 2A depicts a schematic diagram of the memory bay of FIG. 1F.

FIG. 2A depicts one embodiment of a schematic diagram (including word lines and bit lines) corresponding with memory bay 332 in FIG. 1F. As depicted, word lines WL1, WL3, and WL5 are shared between memory arrays 352 and 354 and controlled by row decoder 349 of FIG. 1F. Word lines WL0, WL2, WL4, and WL6 are driven from the left side of memory array 352 and controlled by row decoder 348 of FIG. 1F. Word lines WL14, WL16, WL18, and WL20 are driven from the right side of memory array 354 and controlled by row decoder 350 of FIG. 1F. Bit lines BL0, BL2, BL4, and BL6 are driven from the bottom of memory array 352 and controlled by column decoder 346 of FIG. 1F. Bit lines BL1, BL3, and BL5 are driven from the top of memory array 352 and controlled by column decoder 344 of FIG. 1F.

In one embodiment, the memory arrays 352 and 354 may include memory layers that are oriented in a horizontal plane that is horizontal to the supporting substrate. In another embodiment, the memory arrays 352 and 354 may include memory layers that are oriented in a vertical plane that is vertical with respect to the supporting substrate (i.e., the vertical plane is perpendicular to the supporting substrate).

Figure 2B:
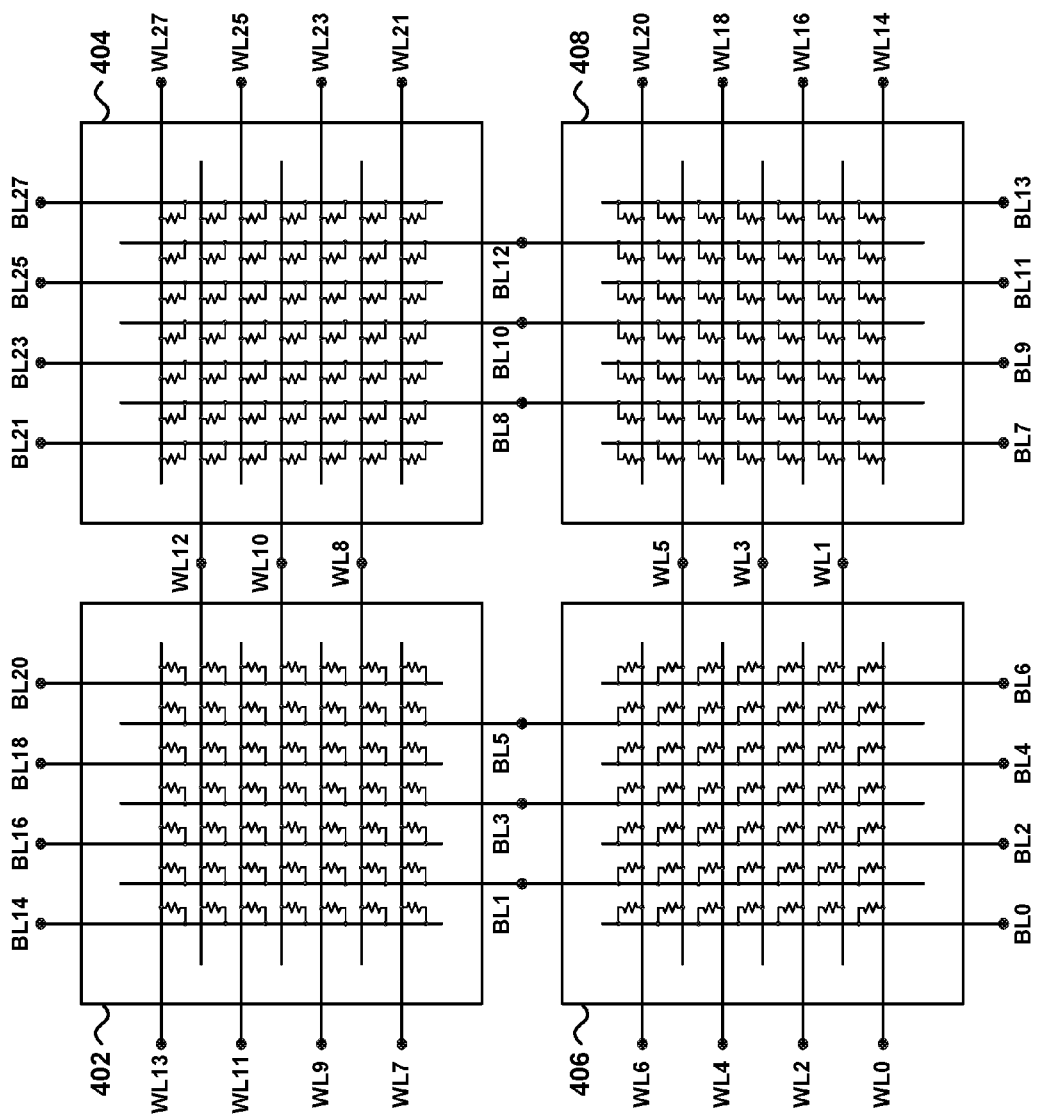
FIG. 2B depicts a schematic diagram of a memory bay arrangement wherein word lines and bit lines are shared across memory blocks, and both row decoders and column decoders are split.

FIG. 2B depicts one embodiment of a schematic diagram (including word lines and bit lines) corresponding with a memory bay arrangement wherein word lines and bit lines are shared across memory blocks, and both row decoders and column decoders are split. Sharing word lines and/or bit lines helps to reduce layout area since a single row decoder and/or column decoder can be used to support two memory arrays. As depicted, word lines WL1, WL3, and WL5 are shared between memory arrays 406 and 408. Bit lines BL1, BL3, and BL5 are shared between memory arrays 406 and 402. Row decoders are split such that word lines WL0, WL2, WL4, and WL6 are driven from the left side of memory array 406 and word lines WL1, WL3, and WL5 are driven from the right side of memory array 406. Column decoders are split such that bit lines BL0, BL2, BL4, and BL6 are driven from the bottom of memory array 406 and bit lines BL1, BL3, and BL5 are driven from the top of memory array 406. Splitting row and/or column decoders also helps to relieve layout constraints (e.g., the column decoder pitch can be relieved by 2× since the split column decoders need only drive every other bit line instead of every bit line).

Figure 3A:
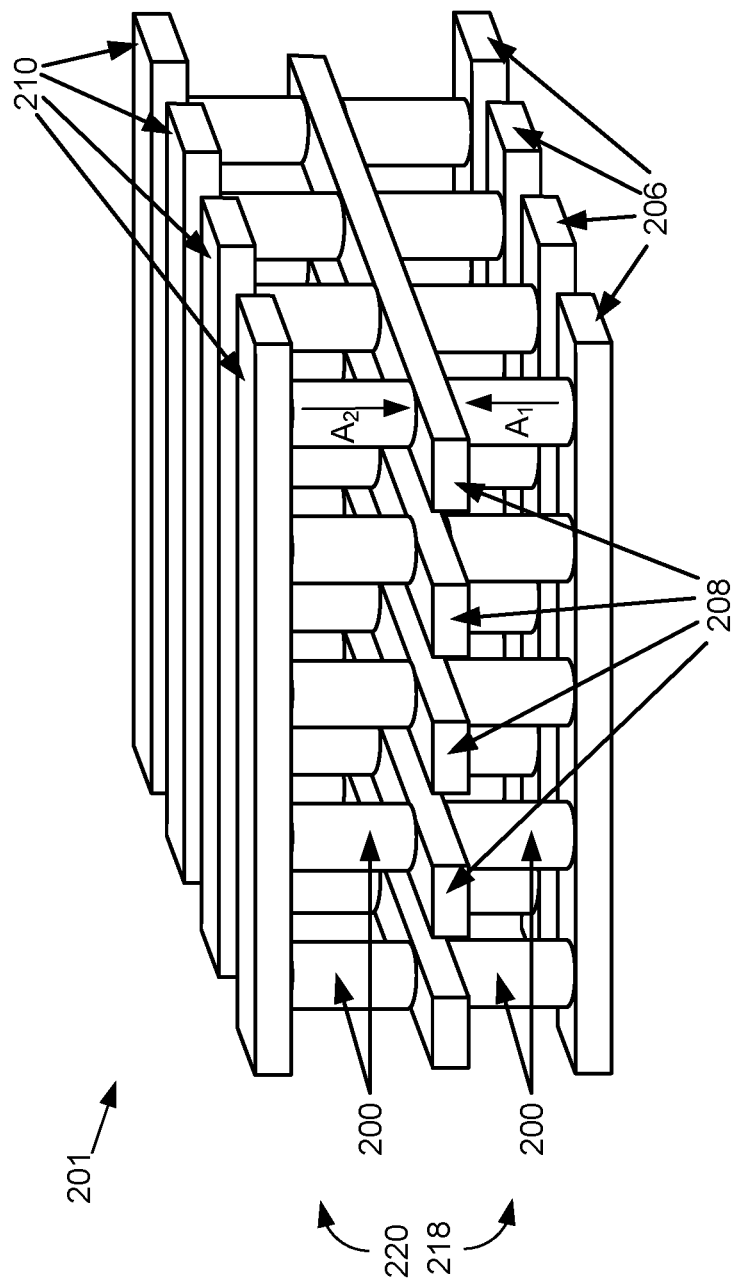
FIG. 3A depicts an embodiment of a portion of a monolithic three-dimensional memory array.

FIG. 3A depicts one embodiment of a portion of a monolithic three-dimensional memory array 201 that includes a second memory level 220 positioned above a first memory level 218. Memory array 201 is one example of an implementation for memory array 301 in FIG. 1E. The bit lines 206 and 210 are arranged in a first direction and the word lines 208 are arranged in a second direction perpendicular to the first direction. As depicted, the upper conductors of first memory level 218 may be used as the lower conductors of the second memory level 220 that is positioned above the first memory level. In a memory array with additional layers of memory cells, there would be corresponding additional layers of bit lines and word lines.

As depicted in FIG. 3A, memory array 201 includes a plurality of memory cells 200. The memory cells 200 may include re-writeable memory cells. The memory cells 200 may include non-volatile memory cells or volatile memory cells. With respect to first memory level 218, a first portion of memory cells 200 are between and connect to bit lines 206 and word lines 208. With respect to second memory level 220, a second portion of memory cells 200 are between and connect to bit lines 210 and word lines 208. In one embodiment, each memory cell includes a steering element (e.g., a diode) and a memory element (i.e., a state change element). In one example, the diodes of the first memory level 218 may be upward pointing diodes as indicated by arrow $A_1$ (e.g., with p regions at the bottom of the diodes), while the diodes of the second memory level 220 may be downward pointing diodes as indicated by arrow $A_2$ (e.g., with n regions at the bottom of the diodes), or vice versa. In another embodiment, each memory cell includes only a state change element. The absence of a diode (or other steering element) from a memory cell may reduce the process complexity and costs associated with manufacturing a memory array.

In one embodiment, the memory cells 200 of FIG. 3A include re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may include resistive RAM (ReRAM) devices.

In another embodiment, the memory cells 200 of FIG. 3A may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Referring to FIG. 3A, in one embodiment of a read operation, the data stored in one of the plurality of memory cells 200 may be read by biasing one of the word lines (i.e., the selected word line) to a selected word line voltage in read mode (e.g., 0V). A sense amplifier may then be used to bias a selected bit line connected to the selected memory cell to the selected bit line voltage in read mode (e.g., 1.0V). In some cases, in order to avoid sensing leakage current from the many unselected word lines to the selected bit line, the unselected word lines may be biased to the same voltage as the selected bit lines (e.g., 1.0V). To avoid leakage current from the selected word line to the unselected bit lines, the unselected bit lines may be biased to the same voltage as the selected word line (e.g., 0V); however, biasing the unselected word lines to the same voltage as the selected bit lines and biasing the unselected bit lines to the same voltage as the selected word line may place a substantial voltage stress across the unselected memory cells driven by both the unselected word lines and the unselected bit lines.

In an alternative read biasing scheme, both the unselected word lines and the unselected bit lines may be biased to an intermediate voltage that is between the selected word line voltage and the selected bit line voltage. Applying the same voltage to both the unselected word lines and the unselected bit lines may reduce the voltage stress across the unselected memory cells driven by both the unselected word lines and the unselected bit lines; however, the reduced voltage stress comes at the expense of increased leakage currents associated with the selected word line and the selected bit line. Before the selected word line voltage has been applied to the selected word line, the selected bit line voltage may be applied to the selected bit line, and a sense amplifier may then sense an auto zero amount of current through the selected memory bit line which is subtracted from the bit line current in a second current sensing when the selected word line voltage is applied to the selected word line. The leakage current may be subtracted out by using the auto zero current sensing.

Referring to FIG. 3A, in one embodiment of a write operation, the reversible resistance-switching material may be in an initial high-resistivity state that is switchable to a low-resistivity state upon application of a first voltage and/or current. Application of a second voltage and/or current may return the reversible resistance-switching material back to the high-resistivity state. Alternatively, the reversible resistance-switching material may be in an initial low-resistance state that is reversibly switchable to a high-resistance state upon application of the appropriate voltage(s) and/or current(s). When used in a memory cell, one resistance state may represent a binary data "0" while another resistance state may represent a binary data "1." In some cases, a memory cell may be considered to include more than two data/resistance states (i.e., a multi-level memory cell). In some cases, a write operation may be similar to a read operation except with a larger voltage range placed across the selected memory cells.

The process of switching the resistance of a reversible resistance-switching element from a high-resistivity state to a low-resistivity state may be referred to as SETTING the reversible resistance-switching element. The process of switching the resistance from the low-resistivity state to the high-resistivity state may be referred to as RESETTING the reversible resistance-switching element. The high-resistivity state may be associated with binary data "1" and the low-resistivity state may be associated with binary data "0." In other embodiments, SETTING and RESETTING operations and/or the data encoding can be reversed. In some embodiments, the first time a resistance-switching element is SET may require a higher than normal programming voltage and may be referred to as a FORMING operation.

Referring to FIG. 3A, in one embodiment of a write operation, data may be written to one of the plurality of memory cells 200 by biasing one of the word lines (i.e., the selected word line) to the selected word line voltage in write mode (e.g., 5V). A write circuit may be used to bias the bit line connected to the selected memory cell to the selected bit line voltage in write mode (e.g., 0V). In some cases, in order to prevent program disturb of unselected memory cells sharing the selected word line, the unselected bit lines may be biased such that a first voltage difference between the selected word line voltage and the unselected bit line voltage is less than a first disturb threshold. To prevent program disturb of unselected memory cells sharing the selected bit line, the unselected word lines may be biased such that a second voltage difference between the unselected word line voltage and the selected bit line voltage is less than a second disturb threshold. The first disturb threshold and the second disturb threshold may be different depending on the amount of time in which the unselected memory cells susceptible to disturb are stressed.

In one write biasing scheme, both the unselected word lines and the unselected bit lines may be biased to an intermediate voltage that is between the selected word line voltage and the selected bit line voltage. The intermediate voltage may be generated such that a first voltage difference across unselected memory cells sharing a selected word line is greater than a second voltage difference across other unselected memory cells sharing a selected bit line. One reason for placing the larger voltage difference across the unselected memory cells sharing a selected word line is that the memory cells sharing the selected word line may be verified immediately after a write operation in order to detect a write disturb.

Figure 3B:
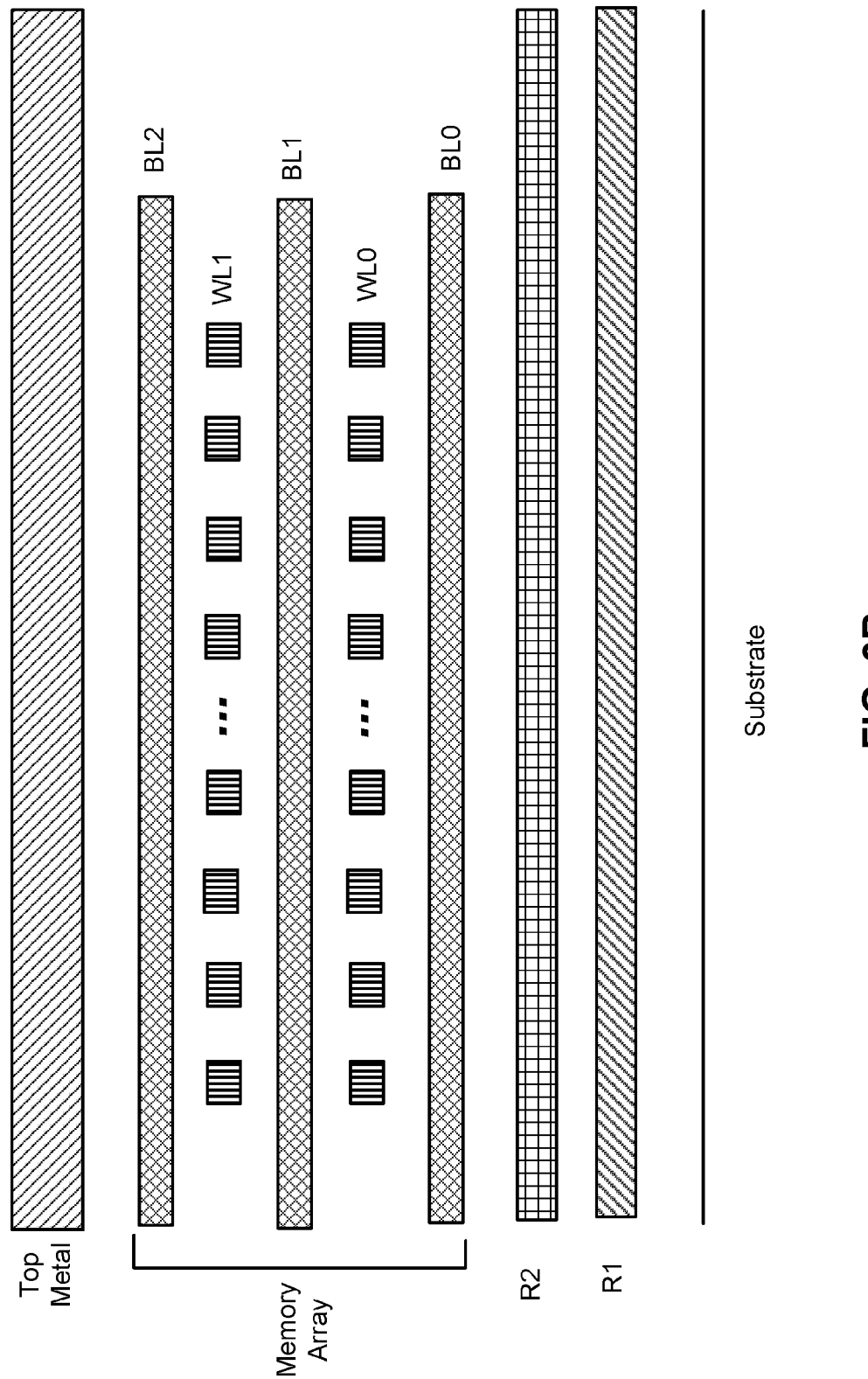
FIG. 3B depicts a subset of the memory array and routing layers of an embodiment of a three-dimensional memory array.

FIG. 3B depicts a subset of the memory array and routing layers of one embodiment of a three-dimensional memory array, such as memory array 301 in FIG. 1E. As depicted, the Memory Array layers are positioned above the Substrate. The Memory Array layers include bit line layers BL0, BL1 and BL2, and word line layers WL0 and WL1. In other embodiments, additional bit line and word line layers can also be implemented. Supporting circuitry (e.g., row decoders, column decoders, and read/write circuits) may be arranged on the surface of the Substrate with the Memory Array layers fabricated above the supporting circuitry. An integrated circuit implementing a three-dimensional memory array may also include multiple metal layers for routing signals between different components of the supporting circuitry, and between the supporting circuitry and the bit lines and word lines of the memory array. These routing layers can be arranged above the supporting circuitry that is implemented on the surface of the Substrate and below the Memory Array layers.

As depicted in FIG. 3B, two metal layers R1 and R2 are used for routing layers; however, other embodiments can include more or less than two metal layers. In one example, these metal layers R1 and R2 are formed of tungsten (about 1 ohm/square). Positioned above the Memory Array layers may be one or more top metal layers used for routing signals between different components of the integrated circuit, such as the Top Metal layer. In one example, the Top Metal layer is formed of copper or aluminum (about 0.05 ohms/square), which may provide a smaller resistance per unit area than metal layers R1 and R2. In some cases, metal layers R1 and R2 may not be implemented using the same materials as those used for the Top Metal layers because the metal used for R1 and R2 must be able to withstand the processing steps for fabricating the Memory Array layers on top of R1 and R2 (e.g., satisfying a particular thermal budget during fabrication).

Figure 3C:
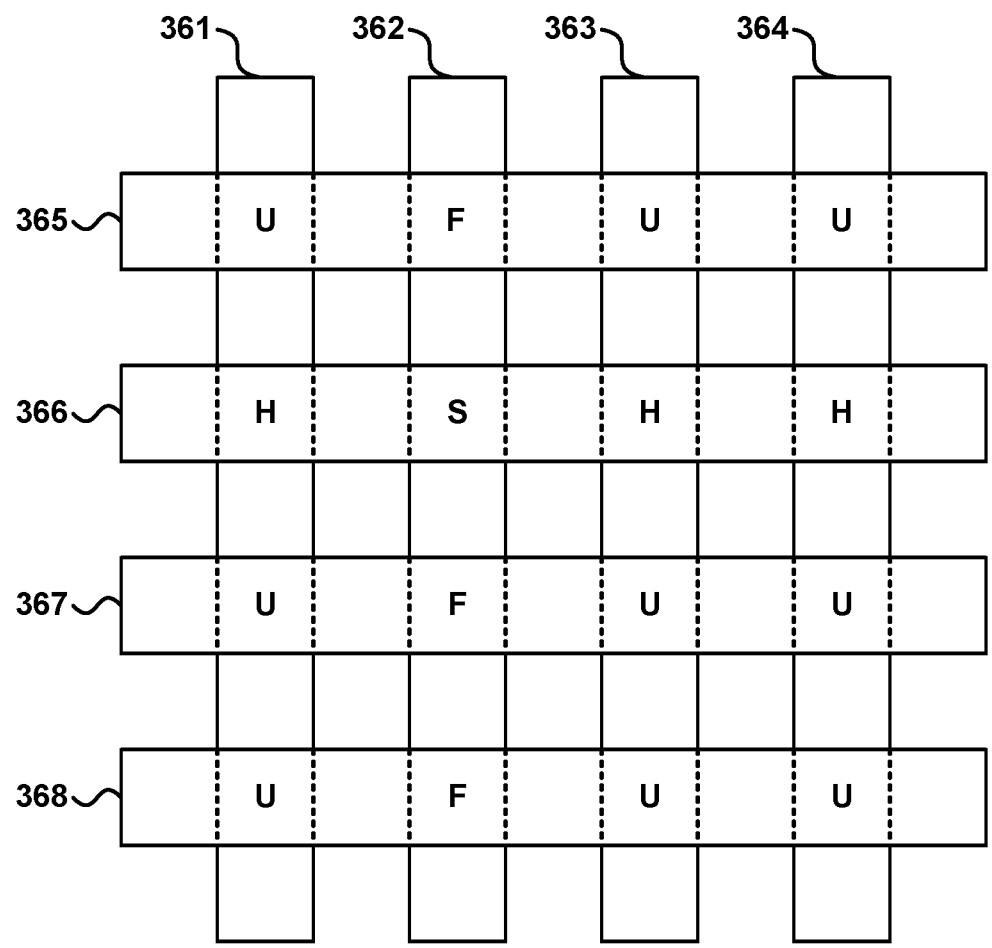
FIGS. 3C-3D depicts various embodiments of a cross-point memory array.

FIG. 3C depicts one embodiment of a cross-point memory array 360. The cross-point memory array 360 may correspond with memory array 201 in FIG. 3A. As depicted, cross-point memory array 360 includes word lines 365-368 and bit lines 361-364. Word line 366 includes a selected word line and bit line 362 includes a selected bit line. At the intersection of selected word line 366 and selected bit line 362 is a selected memory cell (an S cell). The voltage across the S cell is the difference between the selected word line voltage and the selected bit line voltage. Memory cells at the intersections of the selected word line 366 and the unselected bit lines 361, 363, and 364 include unselected memory cells (H cells). H cells are unselected memory cells that share a selected word line that is biased to the selected word line voltage. The voltage across the H cells is the difference between the selected word line voltage and the unselected bit line voltage. Memory cells at the intersections of the selected bit line 362 and the unselected word lines 365, 367, and 368 include unselected memory cells (F cells). F cells are unselected memory cells that share a selected bit line that is biased to a selected bit line voltage. The voltage across the F cells is the difference between the unselected word line voltage and the selected bit line voltage. Memory cells at the intersections of the unselected word lines 365, 367, and 368 and the unselected bit lines 361, 363, and 364 include unselected memory cells (U cells). The voltage across the U cells is the difference between the unselected word line voltage and the unselected bit line voltage.

The number of F cells is related to the length of the bit lines (or the number of memory cells connected to a bit line) while the number of H cells is related to the length of the word lines (or the number of memory cells connected to a word line). The number of U cells is related to the product of the word line length and the bit line length. In one embodiment, each memory cell sharing a particular word line, such as word line 365, may be associated with a particular page stored within the cross-point memory array 360.

Figure 3D:
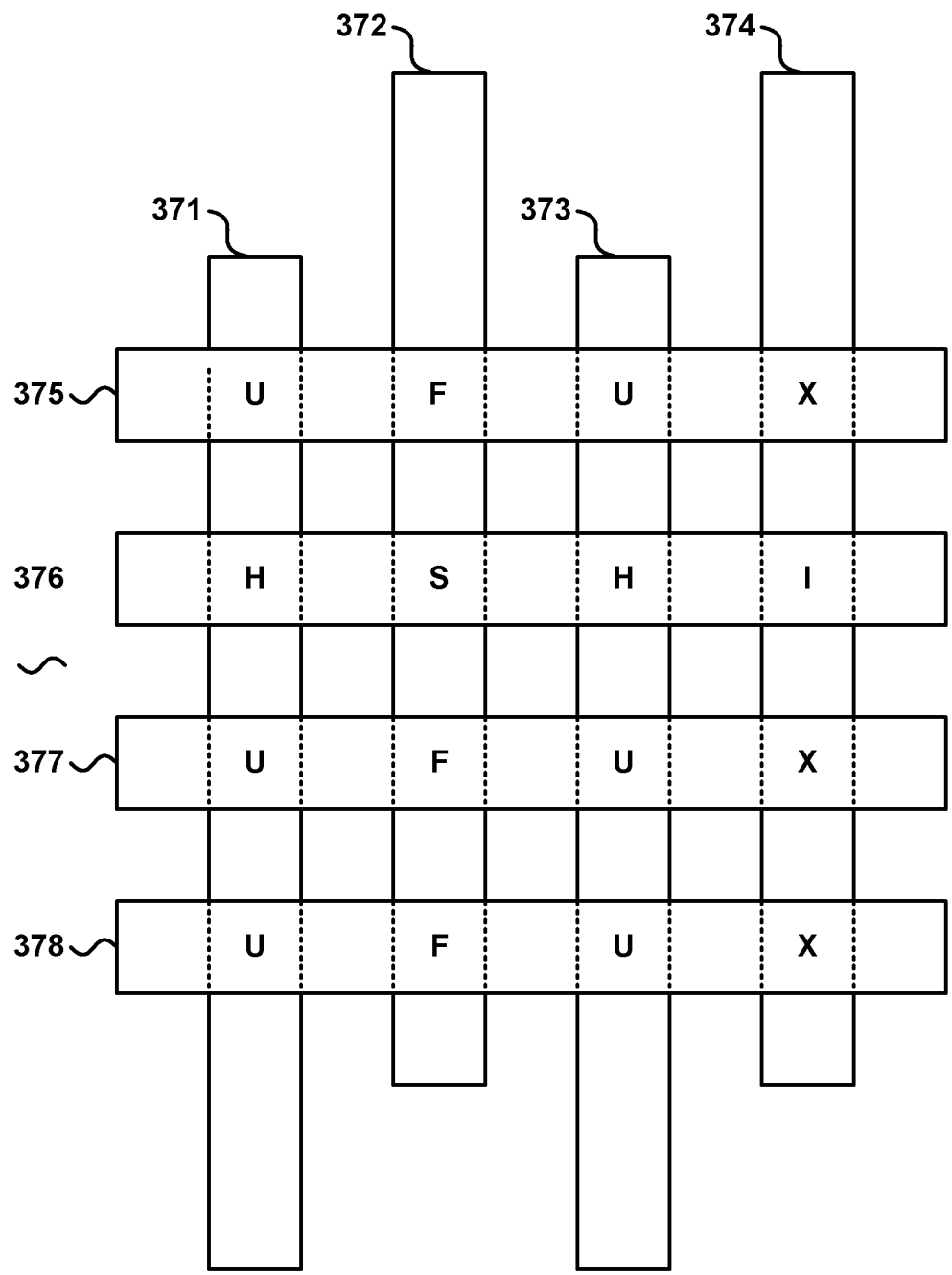

FIG. 3D depicts an alternative embodiment of a cross-point memory array 370. The cross-point memory array 370 may correspond with memory array 201 in FIG. 3A. As depicted, cross-point memory array 370 includes word lines 375-378 and bit lines 371-374. Word line 376 includes a selected word line and bit lines 372 and 374 include selected bit lines. Although both bit lines 372 and 374 are selected, the voltages applied to bit line 372 and bit line 374 may be different. For example, in the case that bit line 372 is associated with a first memory cell to be programmed (i.e., an S cell), then bit line 372 may be biased to a selected bit line voltage in order to program the first memory cell. In the case that bit line 374 is associated with a second memory cell that is not to be programmed (i.e., an I cell), then bit line 374 may be biased to a program inhibit voltage (i.e., to a bit line voltage that will prevent the second memory cell from being programmed).

At the intersection of selected word line 376 and selected bit line 374 is a program inhibited memory cell (an I cell). The voltage across the I cell is the difference between the selected word line voltage and the program inhibit voltage. Memory cells at the intersections of the selected bit line 374 and the unselected word lines 375, 377, and 378 include unselected memory cells (X cells). X cells are unselected memory cells that share a selected bit line that is biased to a program inhibit voltage. The voltage across the X cells is the difference between the unselected word line voltage and the program inhibit voltage. In one embodiment, the program inhibit voltage applied to the selected bit line 374 may be similar to the unselected bit line voltage. In another embodiment, the program inhibit voltage may be a voltage that is greater than or less than the unselected bit line voltage. For example, the program inhibit voltage may be set to a voltage that is between the selected word line voltage and the unselected bit line voltage. In some cases, the program inhibit voltage applied may be a function of temperature. In one example, the program inhibit voltage may track the unselected bit line voltage over temperature.

In one embodiment, two or more pages may be associated with a particular word line. In one example, word line 375 may be associated with a first page and a second page. The first page may correspond with bit lines 371 and 373 and the second page may correspond with bit lines 372 and 374. In this case, the first page and the second page may correspond with interdigitated memory cells that share the same word line. When a memory array operation is being performed on the first page (e.g., a programming operation) and the selected word line 376 is biased to the selected word line voltage, one or more other pages also associated with the selected word line 376 may include H cells because the memory cells associated with the one or more other pages will share the same selected word line as the first page.

In some embodiments, not all unselected bit lines may be driven to an unselected bit line voltage. Instead, a number of unselected bit lines may be floated and indirectly biased via the unselected word lines. In this case, the memory cells of memory array 370 may include resistive memory elements without isolating diodes. In one embodiment, the bit lines 372 and 373 may include vertical bit lines in a three dimensional memory array comprising comb shaped word lines.

Figure 4A:
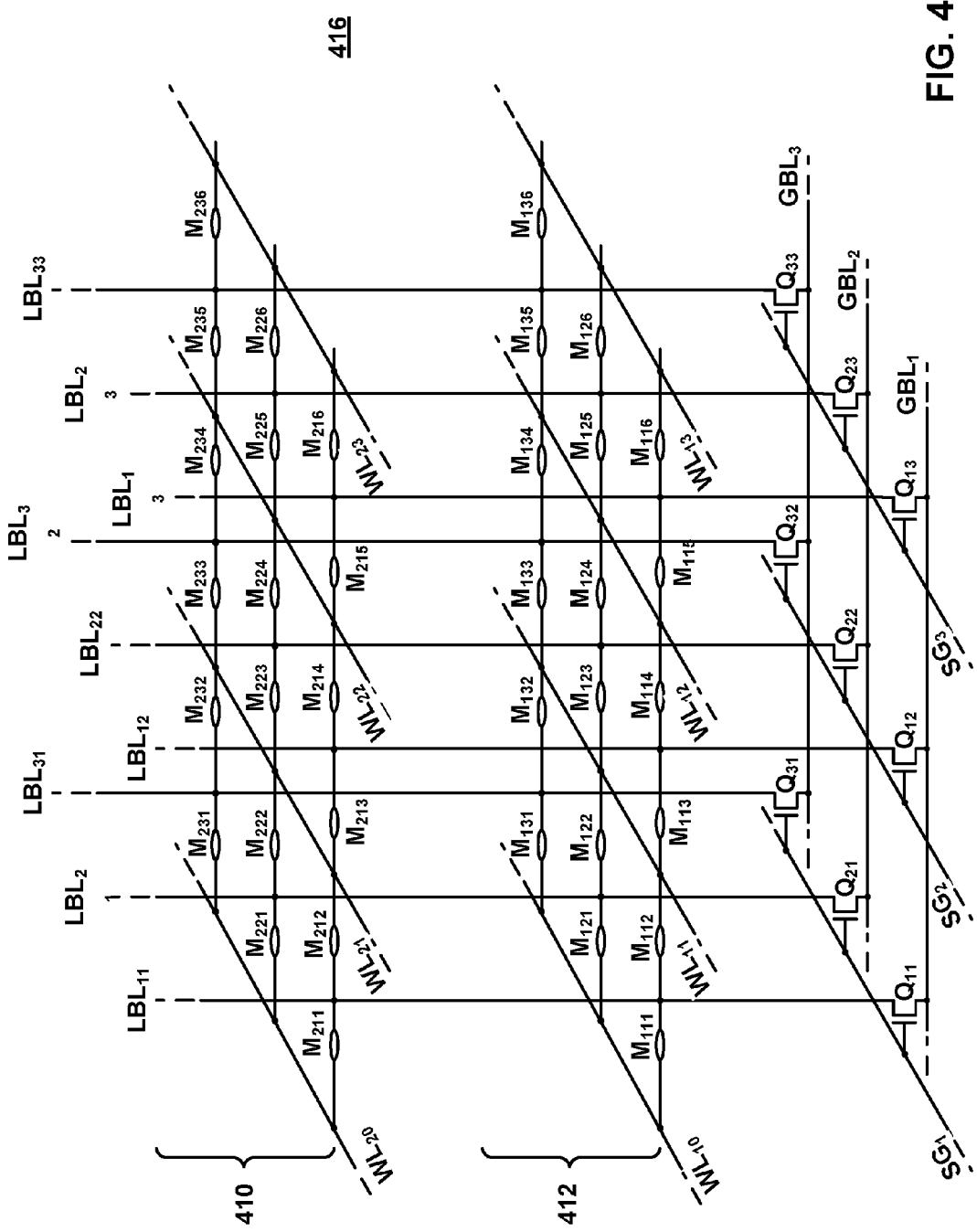
FIG. 4A depicts an embodiment of a portion of a monolithic three-dimensional memory array.

FIG. 4A depicts one embodiment of a portion of a monolithic three-dimensional memory array 416 that includes a first memory level 412 positioned below a second memory level 410. Memory array 416 is one example of an implementation for memory array 301 in FIG. 1E. The local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). The particular memory cell may include a floating gate device or a charge trap device (e.g., using a silicon nitride material). The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GB_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GB_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GB_1$-$GBL_3$ using row select line $SG_3$.

Referring to FIG. 4A, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GB_1$-$GBL_3$, the other local bit lines (e.g., $LBL_{12}$-$LBL_{32}$ and $LBL_{13}$-$LBL_{33}$) must either also be driven to the same global bit lines $GB_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GB_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 416, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 4B:
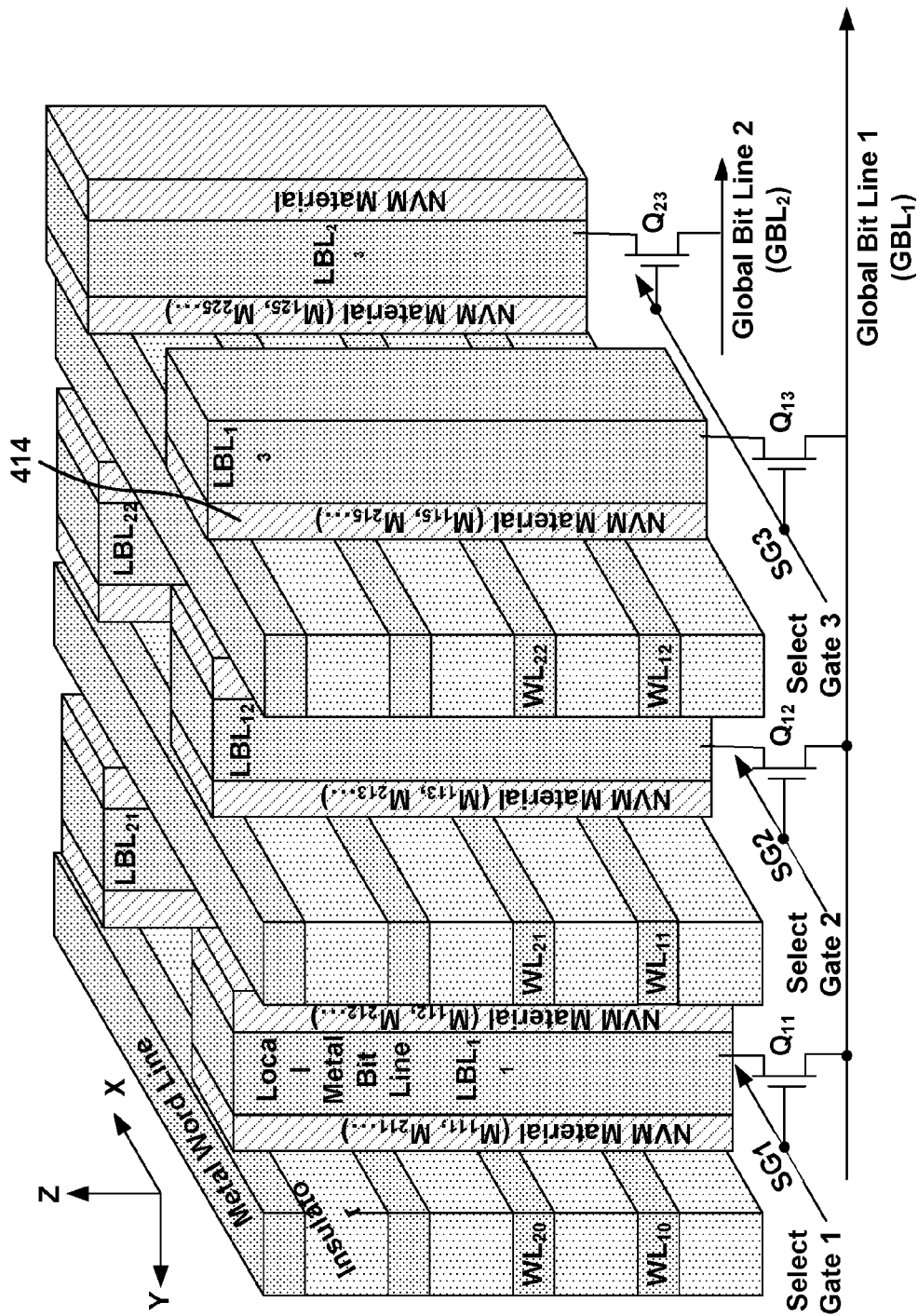
FIG. 4B depicts an embodiment of a portion of a monolithic three-dimensional memory array that includes vertical strips of a non-volatile memory material.

FIG. 4B depicts one embodiment of a portion of a monolithic three-dimensional memory array that includes vertical strips of a non-volatile memory material. The physical structure depicted in FIG. 4B may include one implementation for a portion of the monolithic three-dimensional memory array depicted in FIG. 4A. The vertical strips of non-volatile memory material may be formed in a direction that is perpendicular to a substrate (e.g., in the Z direction). A vertical strip of the non-volatile memory material 414 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may include a single continuous layer of material that may be used by a plurality of memory cells or devices. In one example, portions of the vertical strip of the non-volatile memory material 414 may include a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may include a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may include a MOS device (e.g., an NMOS device) or a vertical TFT.

Figure 5A:
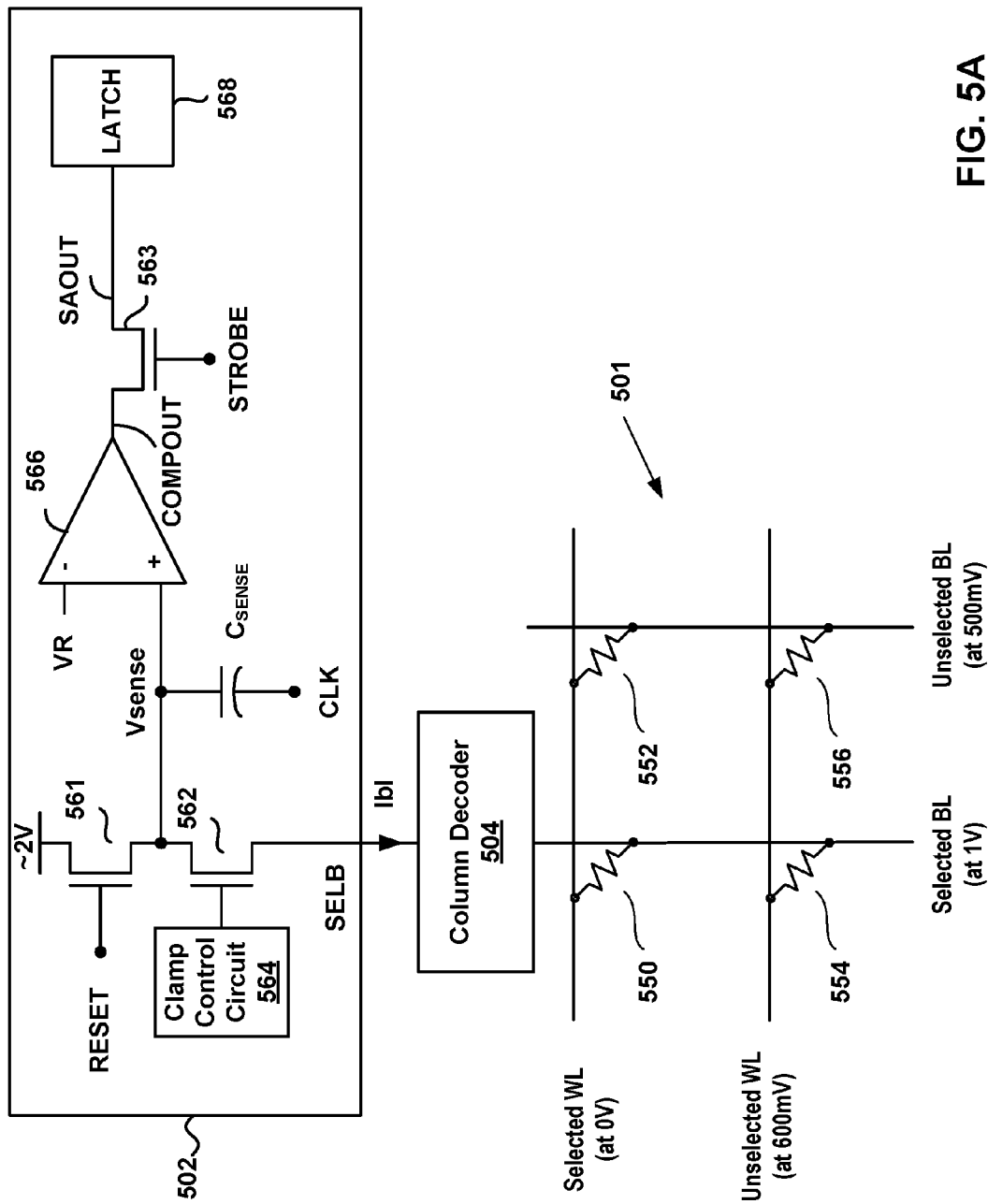
FIG. 5A depicts an embodiment of a sense amplifier and a portion of a memory array.

FIG. 5A depicts an embodiment of a sense amplifier 502 along with a portion of a memory array 501. Sense amplifier 502 is one example of a portion of read/write circuit 306 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may include a memory array with bit lines arranged in a direction horizontal to the substrate, such as memory array 201 in FIG. 3A. In another embodiment, the portion of a memory array 501 may include a memory array with bit lines arranged in a vertical direction that is perpendicular to the substrate, such as memory array 416 in FIG. 4A.

As depicted, during a memory array operation (e.g., a read operation), the selected bit line may be biased to 1 V, the unselected word line may be biased to 1 V, the selected word line may be biased to 0 V, and the unselected bit line may be biased to 1 V. In some embodiments, during a second memory array operation, the selected bit line may be biased to a selected bit line voltage (e.g., 2.0 V), the unselected word line may be biased to an unselected word line voltage (e.g., 1.0 V), the selected word line may be biased to a selected word line voltage (e.g., 0 V), and the unselected bit line may be biased to an unselected bit line voltage (e.g., 1 V). In this case, the unselected memory cells sharing the selected word line will be biased to the voltage difference between the selected word line voltage and the unselected bit line voltage. In other embodiments, the memory array biasing scheme depicted in FIG. 5A may be reversed such that the selected bit line is biased to 0 V, the unselected word line is biased to 0 V, the selected word line is biased to 1 V, and the unselected bit line is biased to 0 V.

As depicted, the SELB node of sense amplifier 502 may be electrically coupled to the selected bit line via column decoder 504. In one embodiment, column decoder 504 may correspond with column decoder 302 depicted in FIG. 1E. Transistor 562 couples (or electrically connects) node SELB to the Vsense node. The transistor 562 may include a low VT nMOS device. Clamp control circuit 564 controls the gate of transistor 562. The Vsense node is connected to transistor 561, a top plate of sense capacitor Csense, and one input (e.g., a non-inverting input) of comparator 566. The bottom plate of capacitor Csense is coupled to a clock signal CLK. The other input (e.g., an inverting input) of comparator 566 receives reference voltage VR, which is the voltage level used for comparing the Vsense node voltage. Comparator 566 provides at an output node COMPOUT a digital output comparison signal (e.g., "0" or "1") based on a difference between the signal on the non-inverting input (Vsense) and the inverting input (VR). Comparator output node COMPOUT is coupled via a switch input node of sampling transistor 563 and a switch output node, SAOUT, to a data latch 568. A gate of transistor 561 is a control signal node coupled to a reset signal RESET, and a gate of sampling transistor 563 is coupled to a strobe signal STROBE. Each time strobe signal STROBE pulses HIGH, sampling transistor 563 turns ON, and the COMPOUT digital output comparison signal of comparator 566 is coupled at node SAOUT to data latch 568.

Figure 5B:
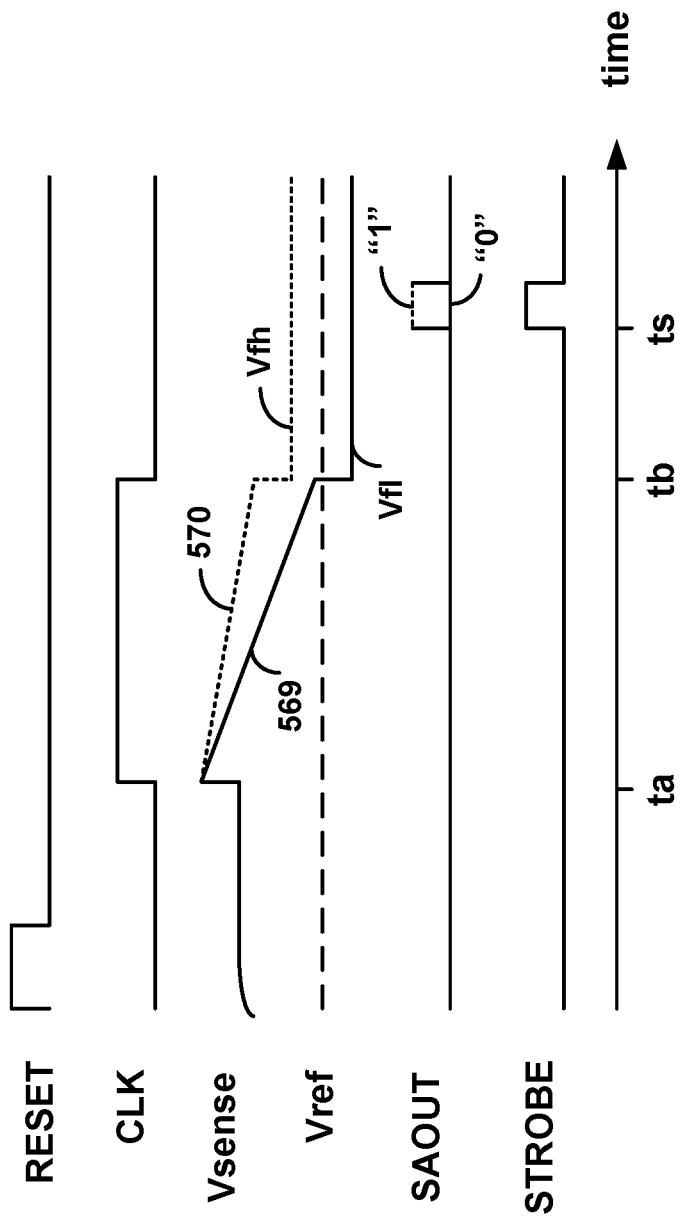
FIG. 5B depicts an example timing diagram of various signals for the embodiment of FIG. 5A.

Referring to FIGS. 5A and 5B, in an embodiment, during a read operation, sense amplifier 502 biases the selected bit line to the selected bit line voltage in read mode. Prior to sensing data, RESET signal turns transistor 561 ON, and precharges the Vsense node to 2V (or some other voltage greater than the selected bit line voltage). When sensing data, sense amplifier 502 attempts to regulate the SELB node to the selected bit line voltage (e.g., 1V) via clamp control circuit 564 and transistor 562 in a source-follower configuration.

At time ta, clock signal CLK goes HIGH, boosting the Vsense node voltage. Because RESET is LOW, transistor 561 is OFF, and the only path for the selected bit line current is through sense capacitor Csense. Thus, the selected bit line current Ibl begins to discharge sense capacitor Csense, at a rate determined by the resistance of the selected memory cell 550. If the selected memory cell 550 is in a low resistance state (e.g., a SET state), current through the selected memory cell 550 will discharge sense capacitor Csense as shown in trace 569. In contrast, if the selected memory cell 550 is in a high resistance state (e.g., a RESET state), current through the selected memory cell 550 will discharge sense capacitor Csense at a lower rate, as shown in trace 570.

At time tb, clock signal CLK goes LOW, pulling the Vsesnse node low, and clamp control circuit 564 puts transistor 562 in a high resistance state. Thus, the Vsense node voltage on capacitor Csense remains constant at a final value Vfl (if the selected memory cell 550 is in a low resistance state) or Vfh (if the selected memory cell 550 is in a high resistance state).

At time ts, strobe signal STROBE goes HIGH, coupling the output of comparator 566 to node SAOUT. If the Vsense node voltage has a final value Vfl, the Vsense node voltage is lower than reference voltage VR, the output of comparator 566 is LOW, and SAOUT has a value of data "0." In contrast, if the Vsense node voltage has a final value Vfh, the Vsense node voltage is higher than reference voltage VR, the output of comparator 566 is HIGH, and SAOUT has a value of data "1." Outputting a data "0" represents that the selected memory cell 550 is in a low resistance state, and outputting a data "1" represents that the selected memory cell 550 is in a high resistance state. Data latch 568 latches the strobed output SAOUT of comparator 566. In the embodiment of FIGS. 5A 5B, a fixed reference voltage VR is coupled to an input of comparator 566.

A high performance low-complexity coding scheme using an advanced Low Density Parity Check (LDPC) code is known for use with storing data in non-volatile memories. LDPC codes can be decoded using iterative message passing decoding algorithms. These algorithms operate by exchanging messages between variable and check nodes over the edges of an underlying bipartite graph representing the code.

The decoder is provided with initial estimates of the stored bits based on the current levels read from the memory cells. These initial estimates are refined and improved by imposing the parity-check constraints that the bits should satisfy as a valid codeword. These initial estimates are then updated through exchange of information between the variable nodes representing the code word bits and the check nodes representing parity-check constraints on the code word bits.

Figure 6:
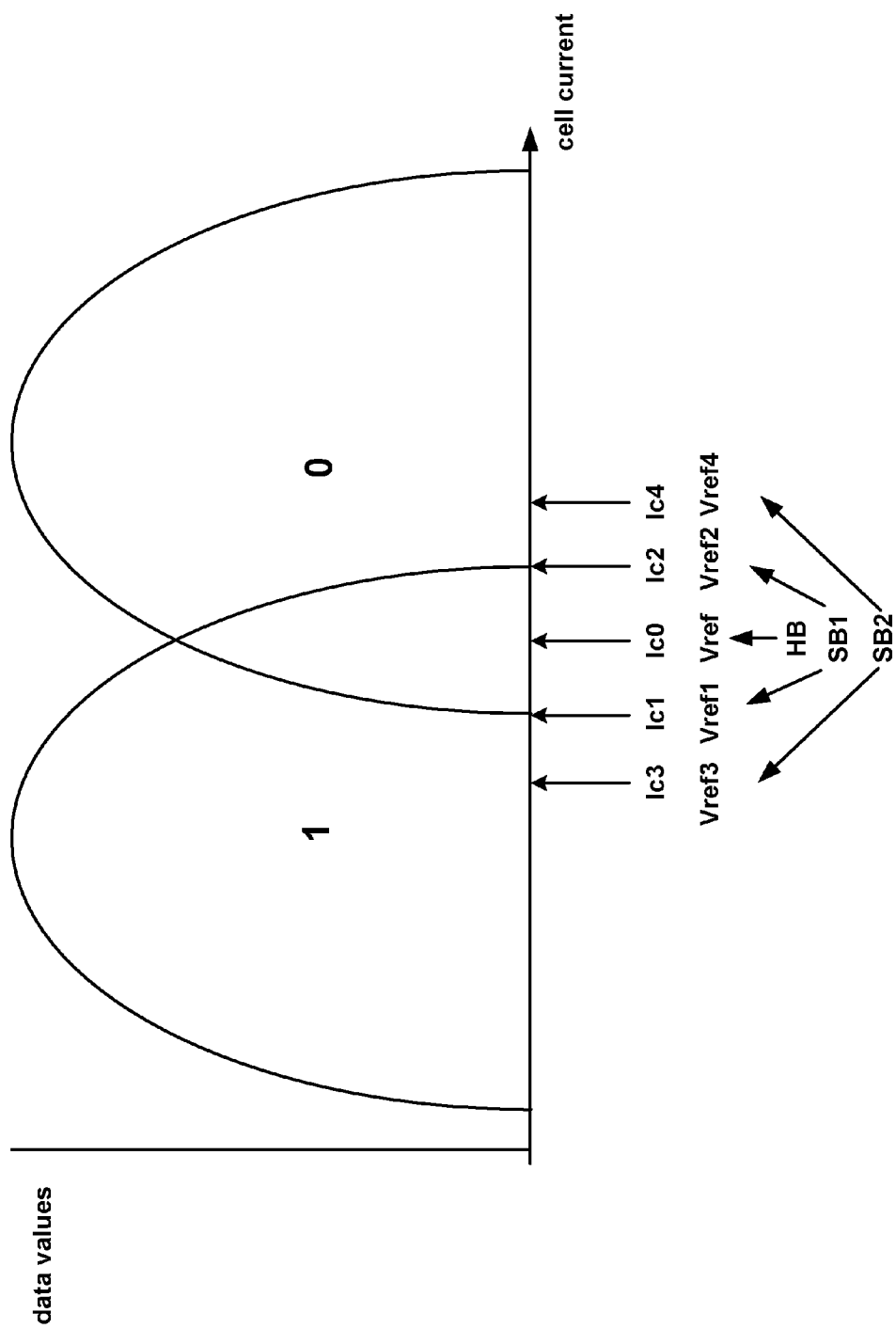
FIG. 6 is an example diagram cell current distributions and data values of a memory cell.

The initial estimates used in LDPC decoding include hard bits and soft bits. Hard bits are an estimate of the actual data being stored. For example, as shown in FIG. 6, hard bits are generally created by sensing the memory cell current (e.g., using sense amplifier 502 of FIG. 5A) using a nominal reference voltage Vref that is determined based on a cell current Ic0 midway between the current of an memory cell in a high resistance state and a low resistance state. Soft bits are extra information from sensing cell current using reference voltage levels other than the nominal reference voltage Vref.

For example, FIG. 6 shows a distribution of cell current reference values Ic0, Ic1, Ic2, Ic3 and Ic4, and corresponding reference voltages Vref, Vref1, Vref2, Vref3 and Vref4, respectively. A first soft bit SB1, may be determined by sensing current reference values Ic1 and Ic2 using reference voltages Vref1 and Vref2, respectively, and a second soft bit SB2 may be determined by sensing cell current reference values Ic3 and Ic4 using reference voltage levels Vref3 and Vref4, respectively. Some memory systems use hard bits and soft bits to decode information sensed from memory cells.

Figure 7:
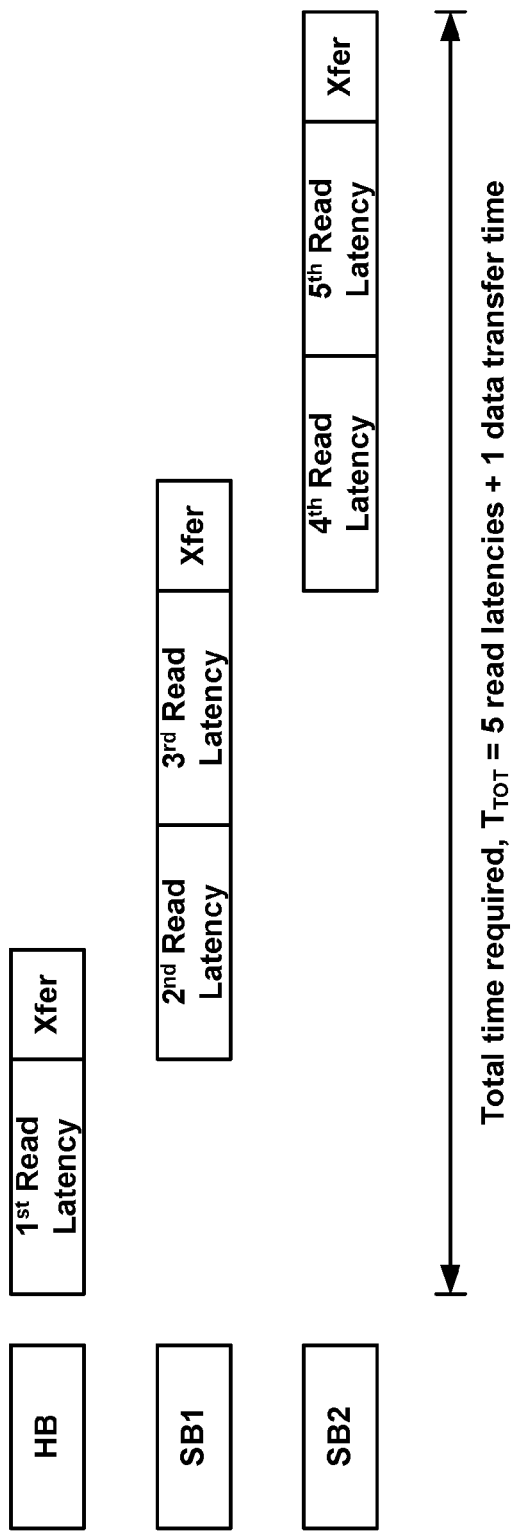
FIG. 7 illustrates an embodiment of a timing diagram for reading a hard bit and two soft bits of a memory cell.

In some memory systems, however, multiple read commands are required to determine the hard bit and soft bit data, such as the hard bit and 2 soft bits depicted in FIG. 6. For example, as shown in FIG. 7, the time required to gather a hard bit and two soft bits is five read latency periods plus one data transfer time, where a read latency period is the duration between the time that a read command issues, and the time the read data are transferred to the system bus.

In particular, the first read latency period is associated with sensing the hard bit using the Vref reference voltage, the second and third read latency periods are associated with sensing the first soft bit using the Vref1 and Vref2 reference voltages, respectively, and the fourth and fifth read latency periods are associated with sensing the second soft bit using the Vref3 and Vref4 reference voltages, respectively. Thus, the total time TTOT required to determine the hard bit and two soft bits is five read latency periods plus one data transfer time. Thus, previously known systems have a significant performance penalty in terms of slower memory read times.

To decrease read processing times, in some embodiments, memory systems determine a hard bit and N soft bits in a total time TTOT equal to a single read latency period plus N+1 data transfer times. In embodiments, memory systems determine a hard bit and N soft bits by using a sense amplifier reference signal that includes 2N+1 distinct reference signal values.

Figure 8:
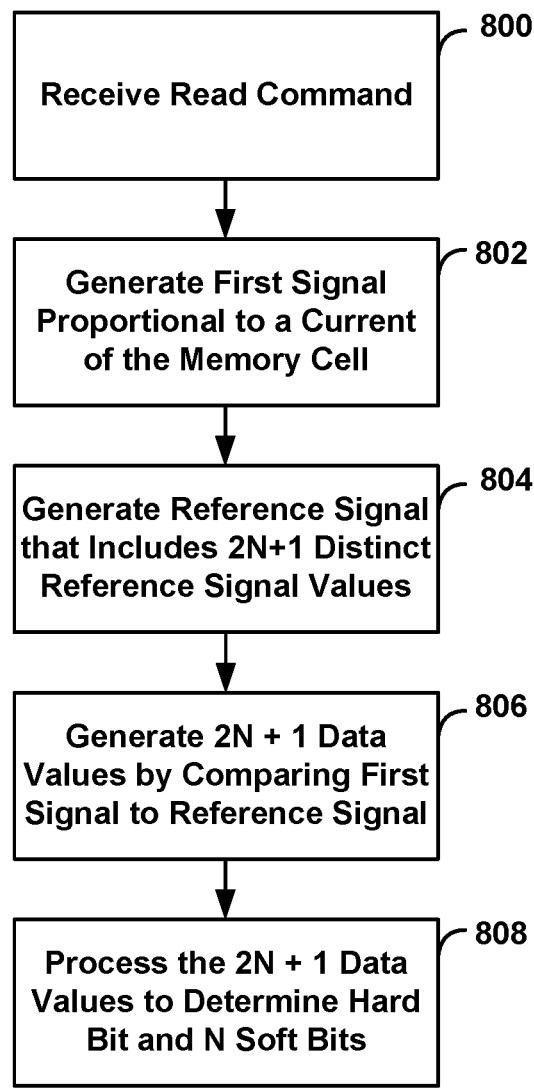
FIG. 8 is an embodiment of a process for reading a hard bit and N soft bits.

Referring now to FIG. 8, a method embodiment is described for determining a hard bit and 2 soft bits in a total time TTOT of one read latency period plus 3 data transfer times. In particular, in a first step 800, a memory chip receives a read command. For example, referring to FIG. 1A, memory chip 102 may receive a read command from memory chip controller 105.

Referring again to FIG. 8, at step 802, in response to the read command, the memory chip generates a sense signal proportional to a current of the memory cell. For example, referring to FIG. 5A, sense amplifier 502 includes circuitry for generating a Vsense signal proportional to the bitline current Ibl of the memory cell.

Referring again to FIG. 8, at step 804, the memory chip generates a reference signal that includes 2N+1 distinct reference signal values. The reference signal may be a voltage or a current. For example, referring to FIG. 1B, for N=2, memory core control circuits 104 may include a signal generator for reference signals 176 that generates a reference voltage that includes five distinct reference voltage values.

Referring again to FIG. 8, at step 806, the memory chip senses 2N+1 cell data values using the reference signal generated at step 804, with each of the 2N+1 cell data values determined based on a corresponding one of the 2N+1 distinct reference signal values. For example, referring to FIG. 1D, read/write circuits 306 may include a sense amplifier that may sense 2N+1 cell data values using the reference signal.

Referring again to FIG. 8, at step 808, the memory chip processes the 2N+1 cell data values determined in step 806 to determine the hard bit and N soft bits. For example, referring again to FIG. 1A, memory chip 102 may include logic circuits or a processor (not shown) that may process the 2N+1 cell data values to determine the hard bit and N soft bits.

Figure 9:
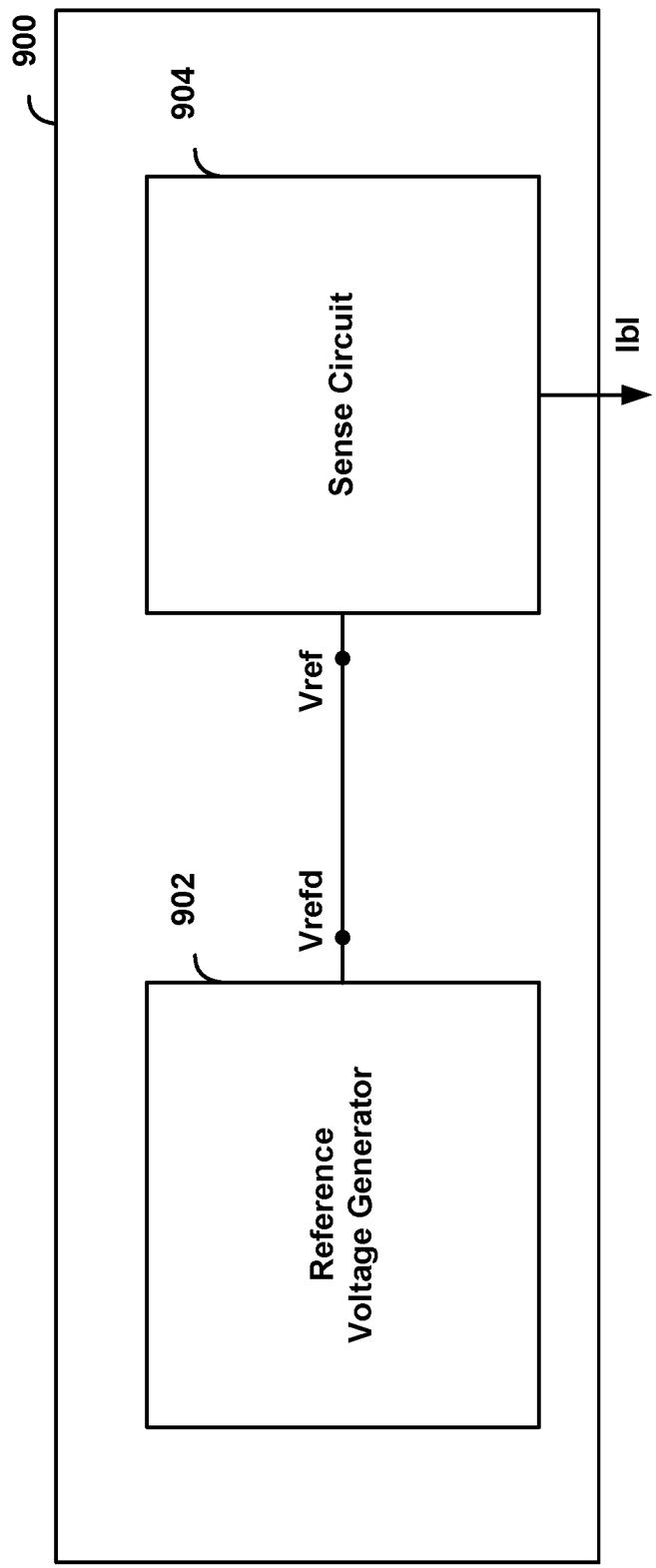
FIG. 9 is a block diagram of an embodiment of a sense amplifier.

Referring now to FIG. 9, an embodiment of a sense amplifier 900 is described that may implement step 806 of FIG. 8. Sense amplifier 900 includes reference voltage generator 902 and sense amplifier 904. Reference voltage generator 902 provides a reference voltage Vrefd at a reference output signal node that includes a 2N+1 distinct reference voltage values. Reference voltage Vrefd is coupled to a reference voltage input signal node VR of sense amplifier 904. Reference voltage generator 902 may be signal generator for reference signals 176 of FIG. 1B. Sense amplifier 904 may be any sense amplifier circuit, such as sense amplifier 502 of FIG. 5A, that may be coupled to a receive a bit line current Ibl at a current sense input signal node from a memory array, such as memory array 501 of FIG. 5A, to read a data state of a selected memory cell. As described below, reference voltage generator 902 provides a reference voltage Vrefd that may be used to determine a hard bit and two soft bits in response to a single read command.

Figure 10A:
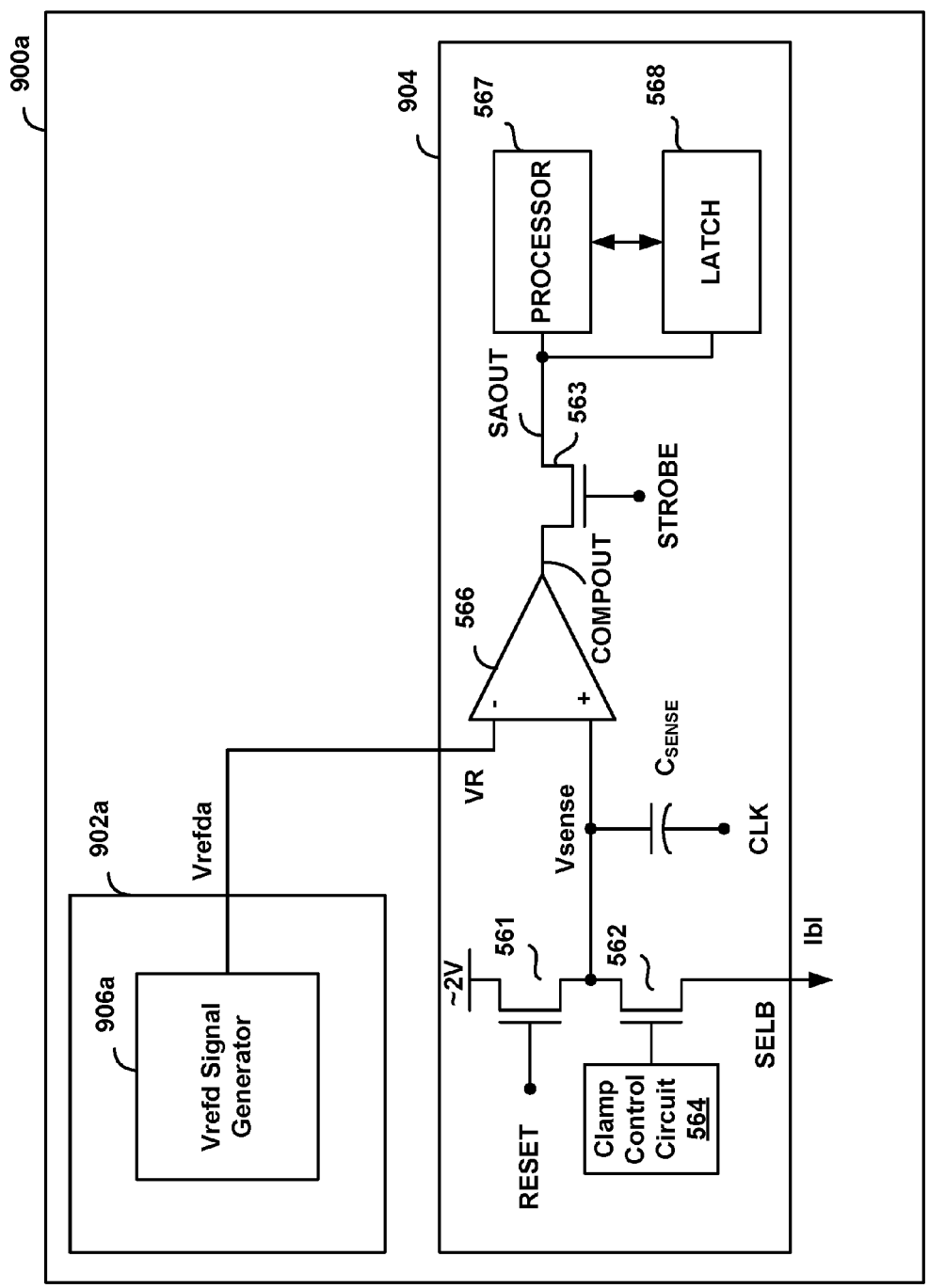
FIG. 10A is an embodiment of the sense amplifier of FIG. 9.
Figure 10B:
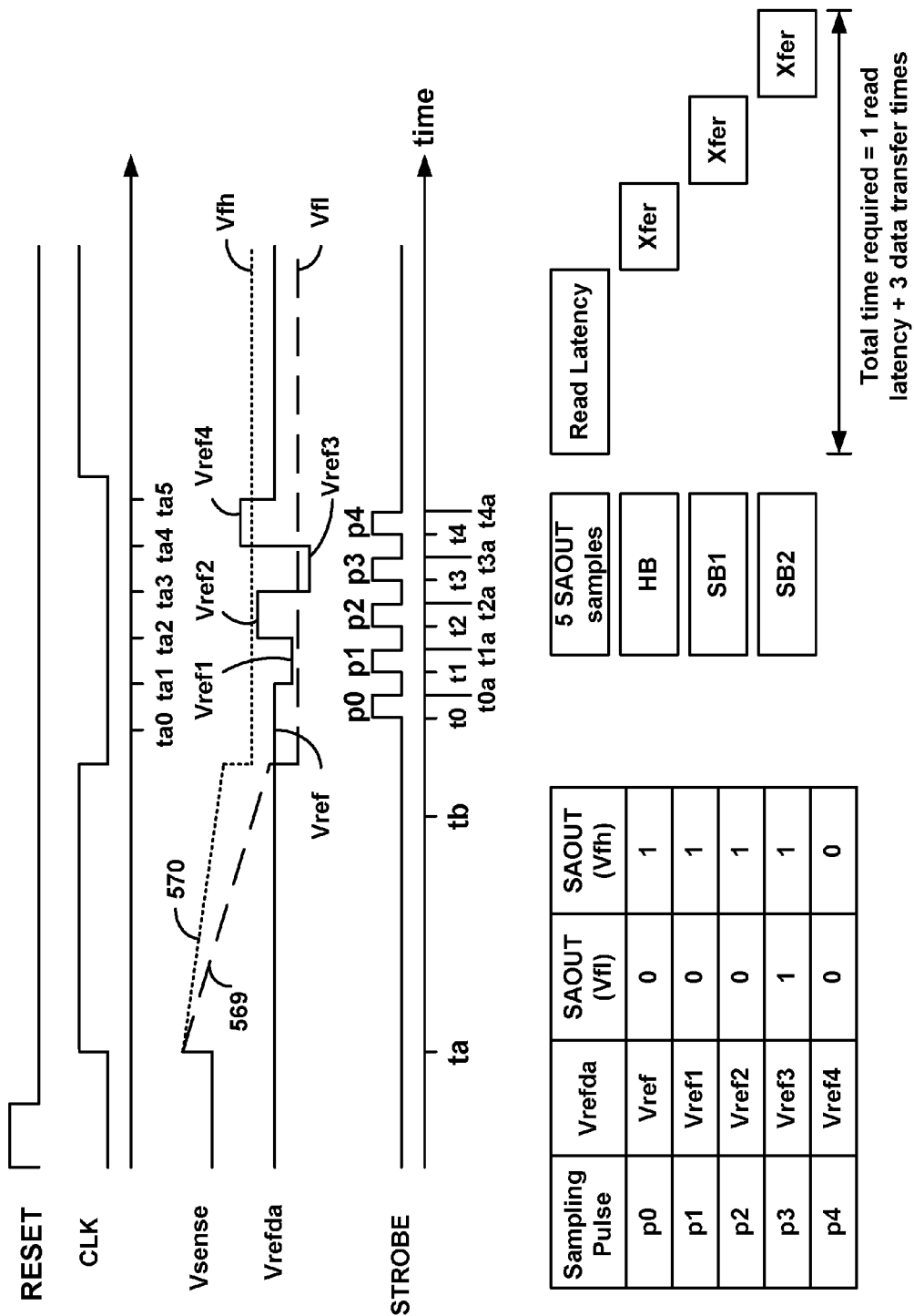
FIG. 10B is an embodiment of a timing diagram of various signals for the sense amplifier of FIG. 10A.

Referring now to FIGS. 10A-10B, an embodiment of sense amplifier 900 for reading a selected memory cell, such as memory cell 550 of FIG. 5A, is described. As illustrated in FIG. 10A, sense amplifier 900a includes reference voltage generator 902a and sense amplifier 904. Reference voltage generator 902a includes Vrefd signal generator 906a that provides a reference voltage Vrefda at a reference output signal node. Sense amplifier 904 includes a reference input signal node VR coupled to the reference output signal node of reference voltage generator 902a, and a current sense input signal node SELB coupled to receive a bit line current Ibl of memory array 501. Sense amplifier 904 generates a sense signal Vsense at a sense signal node proportional to the received bit line current Ibl. As shown in FIG. 10B, and as described in more detail below, reference voltage Vrefda is a step function that includes five distinct step values: Vref, Vref1, Vref2, Vref3 and Vref4, which correspond to the reference values shown in FIG. 6 for determining a hard bit and two soft bits.

At time ta, clock signal CLK goes HIGH, boosting the Vsense sense node voltage. Because RESET is LOW, transistor 561 is OFF, and the only path for the selected bit line current is through sense capacitor Csense. Thus, the selected bit line current Ibl begins to discharge sense capacitor Csense, at a rate determined by the resistance of the selected memory cell. If the selected memory cell is in a low resistance state, current through the selected memory cell will discharge sense capacitor Csense as shown in trace 569. In contrast, if the selected memory cell is in a high resistance state, current through the selected memory cell will discharge sense capacitor Csense at a lower rate, as shown in trace 570.

At time tb, clock signal CLK goes LOW, pulling the Vsesnse node low, and clamp control circuit 564 puts transistor 562 in a high resistance state. Thus, the Vsense node voltage on capacitor Csense remains constant at a final value Vfl (if the selected memory cell 550 is in a low resistance state) or Vfh (if the selected memory cell 550 is in a high resistance state).

During a sensing interval between ta0 and ta5, reference voltage generator 902a provides reference voltage Vrefda that includes a sequence of five distinct reference voltage values for determining the hard bit and two soft bits. In an embodiment, during a first sampling interval Int0 between ta0 and ta1, reference voltage Vrefda has a first value Vref During a second sampling interval Int1 between ta1 and ta2, reference voltage Vrefda has a second value Vref1. During a third sampling interval Int2 between ta2 and ta3, reference voltage Vrefda has a third value Vref2. During a fourth sampling interval Int3 between ta3 and ta4, reference voltage Vrefda has a fourth value Vref3. During a fifth sampling interval Int4 between ta4 and ta5, reference voltage Vrefda has a fifth value Vref4.

Each of the five sampling intervals Int0, Int1, Int2, Int3 and Int4 may be between about 70 ns and about 140 ns, although other sampling interval durations may be used. The five sampling intervals Int0, Int1, Int2, Int3 and Int4 may have equal duration, or may have different durations. During a read operation, the time required to develop word line and bit line voltages (i.e., the time required charge up the word lines and bit lines to the desired voltages and wait for them to settle) may be on the order of about 10 μs. Thus, even at a sampling interval of 140 ns, the time required for five sampling intervals Int0, Int1, Int2, Int3 and Int4 (e.g., 5×140 ns=0.7 μs) is not significant compared to the time required to develop word line and bit line voltages.

Strobe signal STROBE includes five sampling pulses, p0, p1, p2, p3 and p4, with each sampling pulse occurring during a corresponding sampling interval Int0, Int1, Int2, Int3, Int4, respectively. In an embodiment, each sampling pulse goes high after a delay Δt to allow Vrefda to settle to the sampling interval value. For example, sampling pulse p0 is HIGH between time t0 and t0a during first sampling interval Int0, sampling pulse p1 is HIGH between time t1 and t1a during second sampling interval Int1, sampling pulse p2 is HIGH between time t2 and t2a during third sampling interval Int2, sampling pulse p3 is HIGH between time t3 and t3a during fourth sampling interval Int3, and sampling pulse p4 is HIGH between time t4 and t4a during fifth sampling interval Int4. Delay time Δt may have a value between about 35 ns and about 70 ns, and each of sampling pulses p0, p1, p2, p3 and p4 may have a duration between about 35 ns and about 70 ns, although other delay times and time interval durations may be used.

Comparator 566 provides a digital output comparison signal at an output node COMPOUT by comparing Vsense at a first input node and reference voltage Vrefda at a second input node. The five sampling pulses p0, p1, p2, p3 and p4 are used to sample the COMPOUT digital output comparison signal of comparator 566 during a corresponding sampling interval Int0, Int1, Int2, Int3, and Int4, respectively. Sense amplifier 904 generates 2N+1 data values, each data value based on a comparison between sense signal Vsense and a corresponding one of the 2N+1 reference voltage values voltage values Vref, Vref1, Vref2, Vref3 and Vref4.

During sampling pulse p0, the strobed output sample SAOUT(0) equals the COMPOUT digital output comparison signal of comparator 566 based on a difference between the sense node Vsense voltage and VR=Vref. If Vsense has a final value Vfl, SAOUT(0)=0. Otherwise, if Vsense has a final value Vfh, SAOUT(0)=1.

During sampling pulse p1, the strobed output sample SAOUT(1) equals the COMPOUT digital output comparison signal of comparator 566 based on a difference between the sense node Vsense voltage and VR=Vref1. If Vsense has a final value Vfl, SAOUT(1)=0. Otherwise, if Vsense has a final value Vfh, SAOUT(1)=1.

During sampling pulse p2, the strobed output sample SAOUT(2) equals the COMPOUT digital output comparison signal of comparator 566 based on a difference between the sense node Vsense voltage and VR=Vref2. If Vsense has a final value Vfl, SAOUT(2)=0. Otherwise, if Vsense has a final value Vfh, SAOUT(2)=1.

During sampling pulse p3, the strobed output sample SAOUT(3) equals the COMPOUT digital output comparison signal of comparator 566 based on a difference between the sense node Vsense voltage and VR=Vref3. If Vsense has a final value Vfl or Vfh SAOUT(3)=1.

During sampling pulse p4, the strobed output sample SAOUT(4) equals the COMPOUT digital output comparison signal of comparator 566 based on a difference between the sense node Vsense voltage and VR=Vref4. If Vsense has a final value Vfl or Vfh, SAOUT(4)=0. The strobed output samples SAOUT(0), SAOUT(1), SAOUT(2), SAOUT(3) and SAOUT(4) are processed by a processor 567 to determine the hard bit and N soft bits, which are stored in data latch 568.

As shown in FIG. 10B, the time required to obtain the five strobed output samples SAOUT(0), SAOUT(1), SAOUT(2), SAOUT(3) and SAOUT(4) is equal to one read latency period, and the time required to provide the hard bit and two soft bits SB1 and SB2 equals three data transfer times. Thus, the total time TTOT required to determine the hard bit and two soft bits is one read latency period plus three data transfer times. Each data transfer time may be on the order of about 1 μs to about 5 μs, although other data transfer times may be used.

Figure 11B:
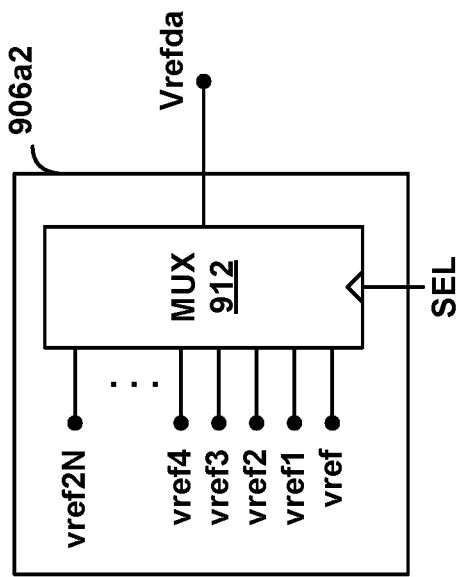
FIG. 11B is another embodiment of the reference signal generator of FIG. 10A.
Figure 11A:
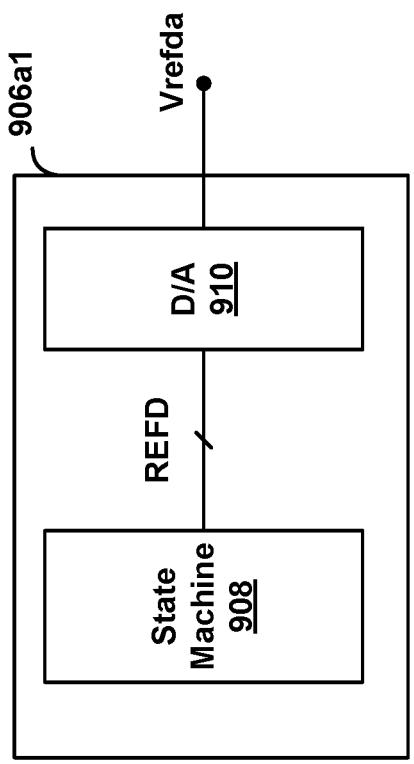
FIG. 11A is an embodiment of the reference signal generator of FIG. 10A.

Referring now to FIG. 11A, an embodiment of Vrefd signal generator 906a is described. Vrefd signal generator 906a1 includes a state machine 908 and a digital-to-analog (D/A) converter 910. State machine provides a digital output signal REFD to a digital input of D/A converter 910. Digital output signal REFD is a digital control word that includes a digital sequence of 2N+1 distinct reference voltage values. For example, for N=2, REFD is a digital control word that includes a digital sequence of reference voltage values Vref, Vref1, Vref2, Vref3 and Vref4. D/A converter 910 converts the digital control word REFD to an output signal Vrefda, which includes a sequence of 2N+1 distinct reference voltage values. For example, for N=2, Vrefda includes a sequence of reference voltage values Vref, Vref1, Vref2, Vref3 and Vref4, such as depicted in FIG. 10B. Persons of ordinary skill in the art will understand that state machine 908 alternatively may be implemented by any digital processor.

Referring now to FIG. 11B, another embodiment of Vrefd signal generator 906a is described. Vrefd signal generator 906a2 includes a multiplexor (MUX) 912 that receives 2N+1 distinct reference voltage values, and provides an output signal Vrefda based on select input SEL which includes a sequence of 2N+1 distinct reference voltage values. For example, for N=2, MUX 912 receives five reference voltage values Vref, Vref1, Vref2, Vref3 and Vref4, and provides an output signal Vrefda that includes a sequence of reference voltage values Vref, Vref1, Vref2, Vref3 and Vref4, such as depicted in FIG. 10B.

Figure 12A:
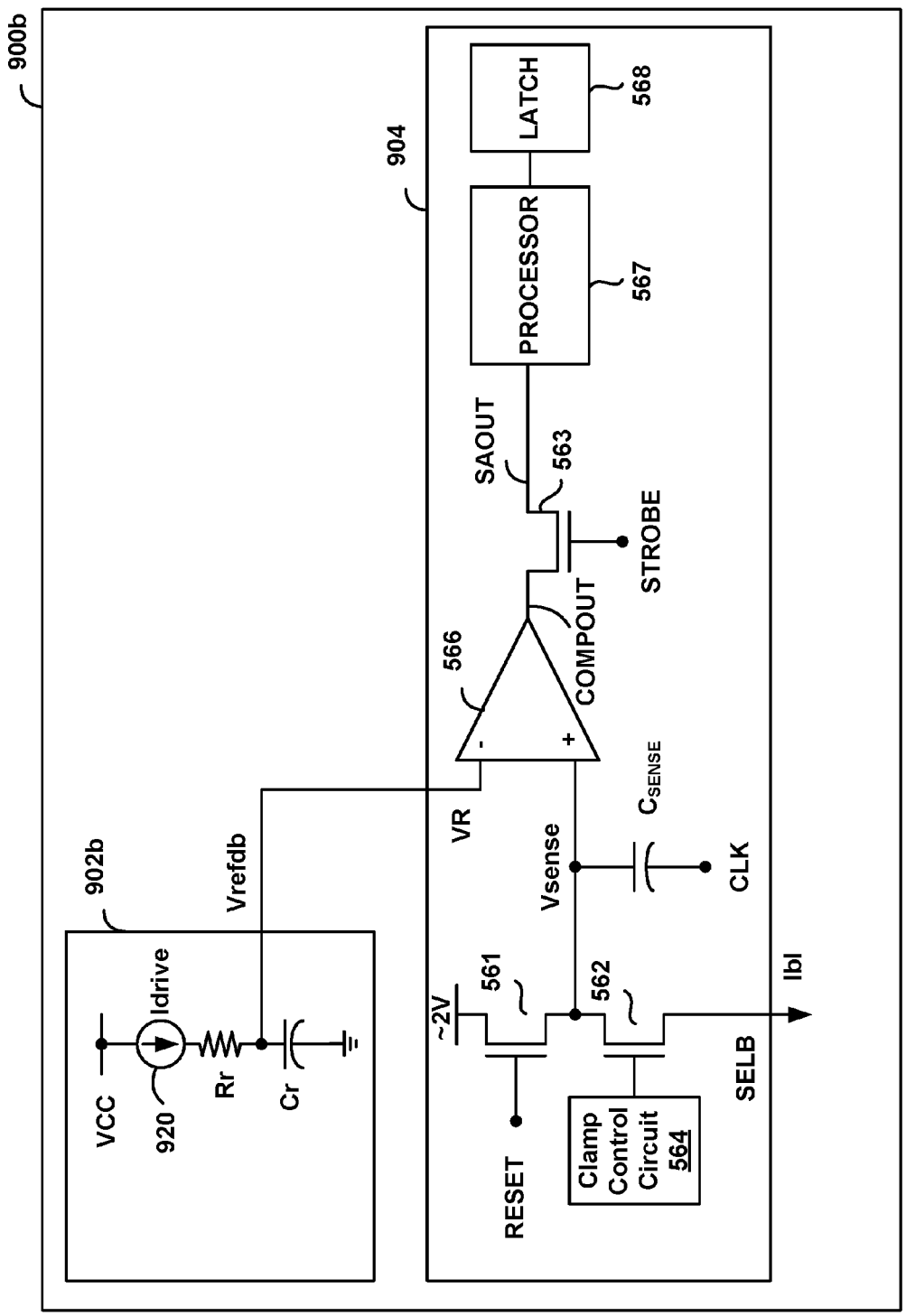
FIG. 12A is another embodiment of the sense amplifier of FIG. 9.
Figure 12B:
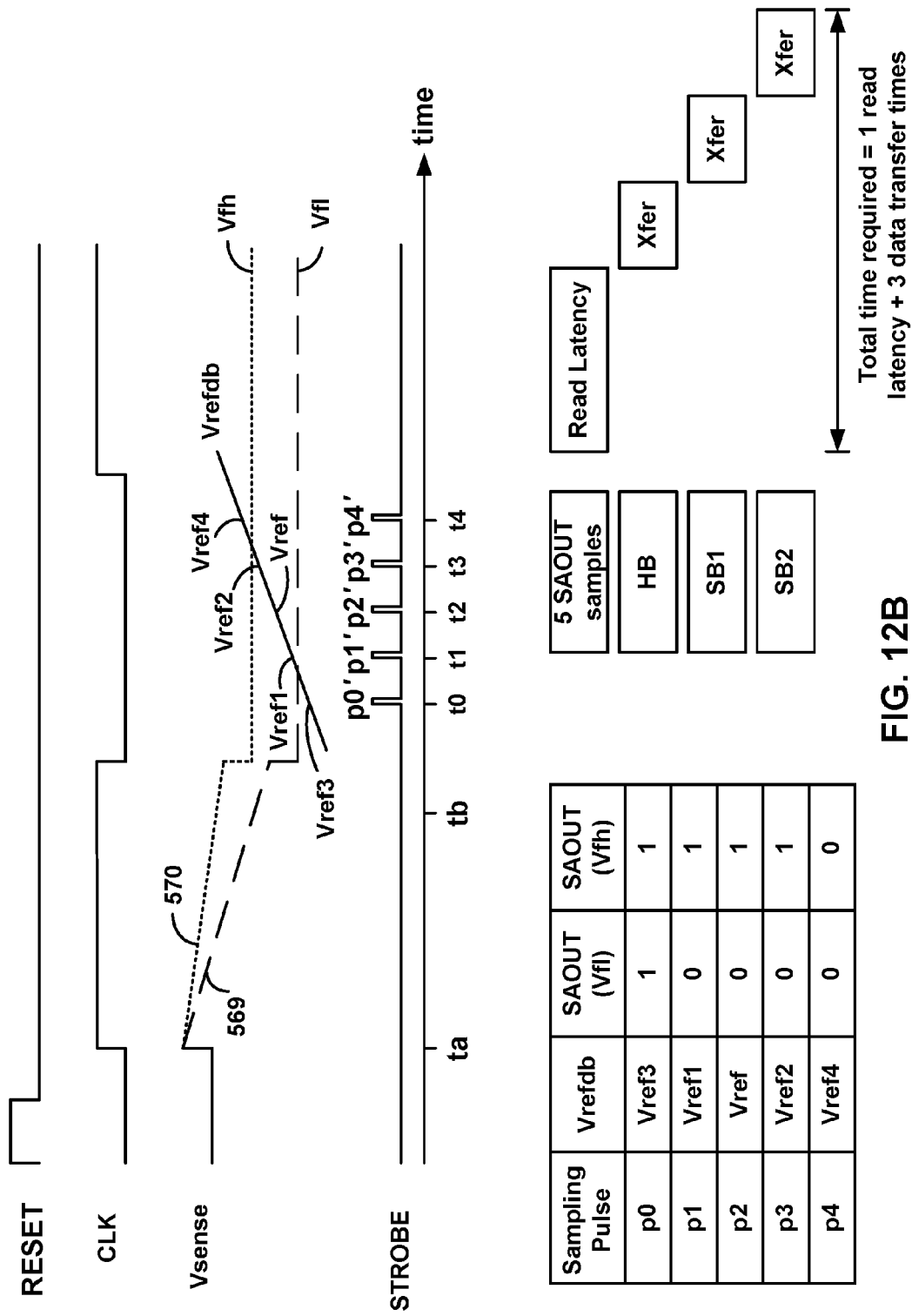
FIG. 12B is an embodiment of a timing diagram of various signals for the sense amplifier of FIG. 12A.

Referring now to FIGS. 12A-12B, another embodiment of sense amplifier 900 for reading a selected memory cell, such as memory cell 550 of FIG. 5A, is described. As illustrated in FIG. 12A, sense amplifier 900b includes reference voltage generator 902b and sense amplifier 904. Reference voltage generator 902b includes a current source 920 that provides a constant current Idrive to resistor-capacitor network that includes a resistor Rr coupled in series with a capacitor Cr. Reference voltage generator 902b provides a reference voltage Vrefdb to a reference output signal node. Sense amplifier 904 includes a reference input signal node VR coupled to the reference output signal node of reference voltage generator 902b, and a current sense input signal node SELB coupled to receive a bit line current Ibl of memory array 501. Sense amplifier 904 generates a sense signal Vsense at a sense signal node proportional to the received bit line current Ibl.

As shown in FIG. 12B, and as described in more detail below, reference voltage Vrefdb, which is the voltage across capacitor Cr, includes a ramp function that includes five distinct reference voltage values Vref, Vref1, Vref2, Vref3 and Vref4, which correspond to the reference values shown in FIG. 6 for determining a hard bit and two soft bits. Values for current Idrive, resistor Rr and capacitor Cr may be selected to achieve any desired slope of reference voltage Vrefdb.

At time ta, clock signal CLK goes HIGH, boosting the Vsense node voltage. Because RESET is LOW, transistor 561 is OFF, and the only path for the selected bit line current is through sense capacitor Csense. Thus, the selected bit line current Ibl begins to discharge sense capacitor Csense, at a rate determined by the resistance of the selected memory cell. If the selected memory cell is in a low resistance state, current through the selected memory cell will discharge sense capacitor Csense as shown in trace 569. In contrast, if the selected memory cell is in a high resistance state, current through the selected memory cell will discharge sense capacitor Csense at a lower rate, as shown in trace 570.

At time tb, clock signal CLK goes LOW, pulling the Vsesnse node low, and clamp control circuit 564 puts transistor 562 in a high resistance state. Thus, the Vsense node voltage on capacitor Csense remains constant at a final value Vfl (if the selected memory cell 550 is in a low resistance state) or Vfh (if the selected memory cell 550 is in a high resistance state).

During a sensing interval between t0 and t4, reference voltage generator 902b provides reference voltage Vrefdb that is a ramp signal that includes five distinct reference voltage values for determining the hard bit and two soft bits. In an embodiment, at a first sampling instance Inst0 at about t0, reference voltage Vrefdb has a first value Vref3. During a second sampling instance Inst1 at about t1, reference voltage Vrefdb has a second value Vref1. During a third sampling instance Inst2 at about t2, reference voltage Vrefdb has a third value Vref. During a fourth sampling instance Inst3 at about t3, reference voltage Vrefdb has a fourth value Vref2. During a fifth sampling instance Inst4 at about t4, reference voltage Vrefdb has a fifth value Vref4. Each of the five sampling instances Inst0, Inst1, Inst2, Inst3 and Inst4 may be between about 70 ns and about 140 ns, although other sampling instance durations may be used.

Strobe signal STROBE includes five sampling pulses, p0', p1', p2', p3' and p4', with each sampling pulse occurring during a corresponding sampling instance Inst0, Inst1, Inst2, Inst3, Inst4, respectively. The five sampling pulses p0', p1', p2', p3' and p4' are used to sample the output of comparator 566 during a corresponding sampling instance Inst0, Inst1, Inst2, Inst3, and Inst4, respectively. Sense amplifier 904 generates 2N+1 data values, each data value based on a comparison between sense signal Vsense and a corresponding one of the 2N+1 reference voltage values voltage values Vref, Vref1, Vref2, Vref3 and Vref4.

During sampling pulse p0', the strobed output sample SAOUT(0) equals the COMPOUT digital output comparison signal of comparator 566 based on a difference between the sense node Vsense voltage and VR=Vref3. If Vsense has a final value Vfl or Vfh, SAOUT(0)=1.

During sampling pulse p1', the strobed output sample SAOUT(1) equals the COMPOUT digital output comparison signal of comparator 566 based on a difference between the sense node Vsense voltage and VR=Vref1. If Vsense has a final value Vfl, SAOUT(1)=0. Otherwise, if Vsense has a final value Vfh, SAOUT(1)=1.

During sampling pulse p2', the strobed output sample SAOUT(2) equals the COMPOUT digital output comparison signal of comparator 566 based on a difference between the sense node Vsense voltage and VR=Vref. If Vsense has a final value Vfl, SAOUT(2)=0. Otherwise, if Vsense has a final value Vfh, SAOUT(2)=1.

During sampling pulse p3', the strobed output sample SAOUT(3) equals the COMPOUT digital output comparison signal of comparator 566 based on a difference between the sense node Vsense voltage and VR=Vref2. If Vsense has a final value Vfl, SAOUT(3)=0. Otherwise, if Vsense has a final value Vfh, SAOUT(3)=1.

During sampling pulse p4', the strobed output sample SAOUT(4) equals the output of comparator 566 based on a difference between the sense node Vsense voltage and VR=Vref4. If Vsense has a final value Vfl or Vfh, SAOUT(4)=0. The strobed output samples SAOUT(0), SAOUT(1), SAOUT(2), SAOUT(3) and SAOUT(4) are processed by processor 567 to determine the hard bit and N soft bits, which are stored in data latch 568.

As shown in FIG. 12B, the time required to obtain the five strobed output samples SAOUT(0), SAOUT(1), SAOUT(2), SAOUT(3) and SAOUT(4) is equal to one read latency period, and the time required to provide the hard bit and two soft bits SB1 and SB2 equals three data transfer times. Thus, the total time $T_{TOT}$ required to determine the hard bit and two soft bits is one read latency period plus three data transfer times. Each data transfer time may be on the order of about 1 µs to about 5 µs, although other data transfer times may be used.

One embodiment of the disclosed technology includes a method for reading a memory cell of a nonvolatile memory system. The method includes generating a hard bit and N soft bits for the memory cell in a total time corresponding to a single read latency period and N+1 data transfer times.

One embodiment of the disclosed technology includes a method for reading a hard bit and N soft bits of a memory cell of a nonvolatile memory system in response to a single read command. The method includes generating a sense signal proportional to a current of the memory cell, generating a reference signal that comprises 2N+1 distinct reference signal values, generating a comparison signal by comparing the sense signal and the reference signal, sampling the comparison signal to generate 2N+1 data values, and determining the hard bit and the N soft bits based on the 2N+1 data values.

One embodiment of the disclosed technology includes a circuit for reading a hard bit and N soft bits of a memory cell of a nonvolatile memory system in response to a single read command. The circuit includes a reference generator for generating at a reference output signal node a reference signal that comprises 2N+1 distinct reference signal values, a sense amplifier that includes a reference input signal node coupled to the reference output signal node of the reference generator, and a current sense input signal node coupled to receive a current of the memory cell, and a processor for determining the hard bit and the N soft bits based on the 2N+1 data values. The sense amplifier is configured to generate a sense signal at a sense signal node proportional to the received current; and generate 2N+1 data values, each data value based on a comparison between the sense signal and a corresponding one of the 2N+1 reference signal values.

One embodiment of the disclosed technology includes a method for reading a hard bit and N soft bits of a memory cell of a nonvolatile memory system in response to a single read command, the method includes providing a reference generator for generating at a reference output signal node a reference signal that comprises 2N+1 distinct reference signal values, providing a sense amplifier that includes a reference input signal node coupled to the reference output signal node of the reference generator, and a current sense input signal node coupled to receive a current of the memory cell, and providing a processor for determining the hard bit and the N soft bits based on the 2N+1 data values. The sense amplifier is configured to generate a sense signal at a sense signal node proportional to the received current, and generate 2N+1 data values, each data value based on a comparison between the sense signal and a corresponding one of the 2N+1 reference signal values.

For purposes of this document, each process associated with the disclosed technology may be performed continuously and by one or more computing devices. Each step in a process may be performed by the same or different computing devices as those used in other steps, and each step need not necessarily be performed by a single computing device.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for reading a memory cell of a nonvolatile memory system, the method comprising:
   generating a hard bit and N soft bits for the memory cell in a total time corresponding to a single read latency period and N+1 data transfer times;
   generating a reference signal that comprises 2N+1 distinct reference signal values;
   coupling the memory cell to a first input of a comparator; and
   coupling the reference signal to a second input of the comparator,
   wherein generating a hard bit and N soft bits comprises obtaining 2N+1 samples of an output of the comparator.

2. The method of claim 1, wherein the reference signal comprises a step function that includes 2N+1 step values.

3. The method of claim 1, wherein the reference signal comprises a ramp function.

* * * * *